(12) United States Patent
Lin et al.

(10) Patent No.: US 9,425,178 B2
(45) Date of Patent: Aug. 23, 2016

(54) RDL-FIRST PACKAGING PROCESS

(71) Applicant: Taiwan Semiconductor Manufacturing Company, Ltd., Hsin-Chu (TW)

(72) Inventors: Chih-Wei Lin, Zhubei (TW); Shing-Chao Chen, Zhubei (TW); Meng-Tse Chen, Changzhi Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 14/325,842

(22) Filed: Jul. 8, 2014

(65) Prior Publication Data

US 2016/0013172 A1   Jan. 14, 2016

(51) Int. Cl.
*H01L 21/44* (2006.01)
*H01L 25/00* (2006.01)
(Continued)

(52) U.S. Cl.
CPC ......... *H01L 25/50* (2013.01); *H01L 21/31053* (2013.01); *H01L 21/568* (2013.01); *H01L 21/6835* (2013.01); *H01L 21/76802* (2013.01); *H01L 21/76877* (2013.01); *H01L 21/78* (2013.01); *H01L 24/11* (2013.01); *H01L 24/81* (2013.01); *H01L 24/96* (2013.01); *H01L 24/97* (2013.01); *H01L 25/0657* (2013.01); *H01L 23/3128* (2013.01); *H01L 2221/6834* (2013.01); *H01L 2221/68318* (2013.01); *H01L 2221/68327* (2013.01); *H01L 2221/68359* (2013.01); *H01L 2221/68381* (2013.01); *H01L 2224/0231* (2013.01); *H01L 2224/02372* (2013.01); *H01L 2224/0346* (2013.01); *H01L 2224/11334* (2013.01); *H01L 2224/13024* (2013.01); *H01L 2224/16225* (2013.01); *H01L 2224/48091* (2013.01); *H01L 2224/81801* (2013.01); *H01L 2225/0651* (2013.01); *H01L 2225/06513* (2013.01); *H01L 2225/06517* (2013.01); *H01L 2225/06541* (2013.01); *H01L 2225/06568* (2013.01); *H01L 2225/1023* (2013.01); *H01L 2225/1041* (2013.01);
(Continued)

(58) Field of Classification Search
CPC . H01L 25/50; H01L 25/0657; H01L 21/561; H01L 21/565; H01L 21/31053; H01L 21/6835; H01L 21/76802; H01L 21/76877; H01L 21/71; H01L 24/11; H01L 24/81; H01L 24/96; H01L 24/97
USPC .................................................. 438/108, 113
See application file for complete search history.

(56) References Cited

U.S. PATENT DOCUMENTS

| | | | |
|---|---|---|---|
| 2013/0062761 A1* | 3/2013 | Lin ................... | H01L 23/49816 257/738 |
| 2013/0252383 A1* | 9/2013 | Chen ...................... | H01L 24/97 438/127 |
| 2014/0210081 A1* | 7/2014 | Lin ....................... | H01L 21/561 257/738 |

*Primary Examiner* — Kevin M Picardat
(74) *Attorney, Agent, or Firm* — Slater Matsil, LLP

(57) ABSTRACT

A method includes forming a first plurality of Redistribution Lines (RDLs) over a carrier, and bonding a device die to the first plurality of RDLs through flip-chip bonding. The device die and the first plurality of RDLs are over the carrier. The device die is molded in a molding material. After the molding, the carrier is detached from the first plurality of RDLs. The method further includes forming solder balls to electrically couple to the first plurality of RDLs, wherein the solder balls and the device die are on opposite sides of the first plurality of RDLs.

20 Claims, 25 Drawing Sheets

(51) Int. Cl.
*H01L 25/065* (2006.01)
*H01L 21/78* (2006.01)
*H01L 23/00* (2006.01)
*H01L 21/683* (2006.01)
*H01L 21/768* (2006.01)
*H01L 21/3105* (2006.01)
*H01L 21/56* (2006.01)
*H01L 23/31* (2006.01)

(52) U.S. Cl.
CPC .................. *H01L 2225/1058* (2013.01); *H01L 2924/15311* (2013.01); *H01L 2924/16152* (2013.01); *H01L 2924/18161* (2013.01)

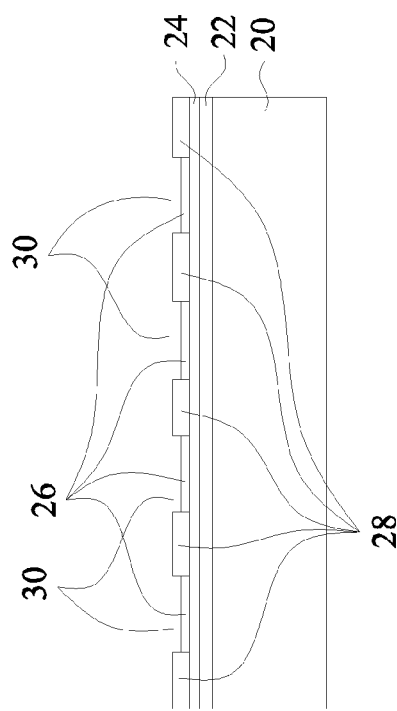
FIG. 1
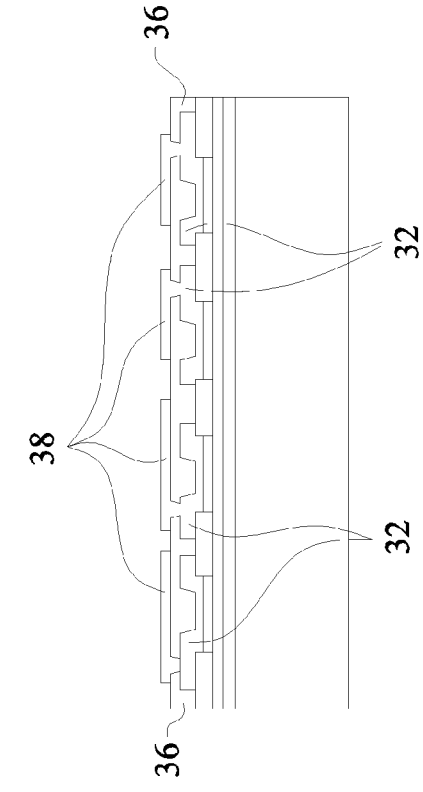
FIG. 2
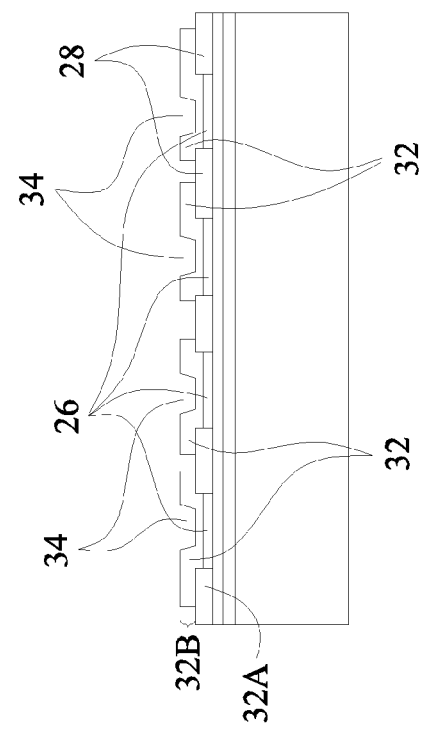
FIG. 3
FIG. 4

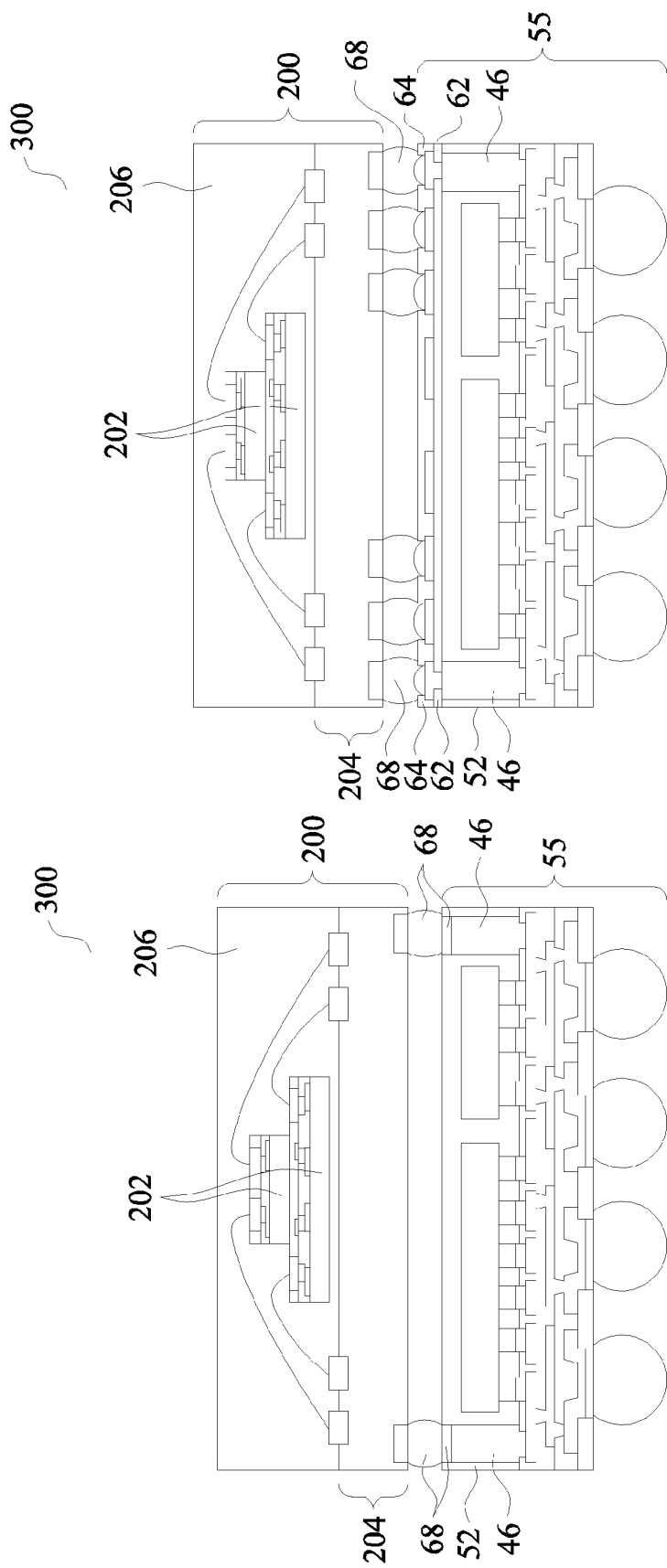

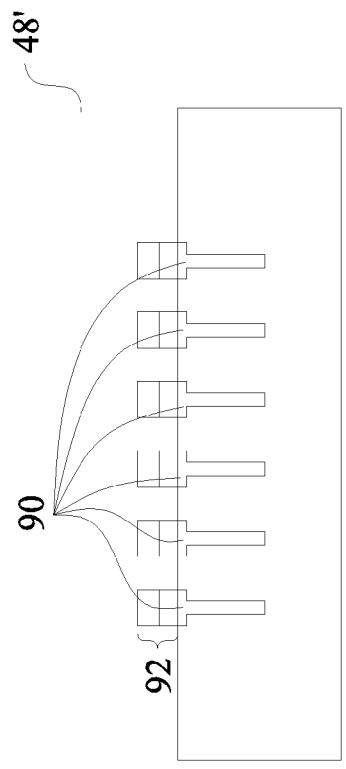
FIG. 37
FIG. 38
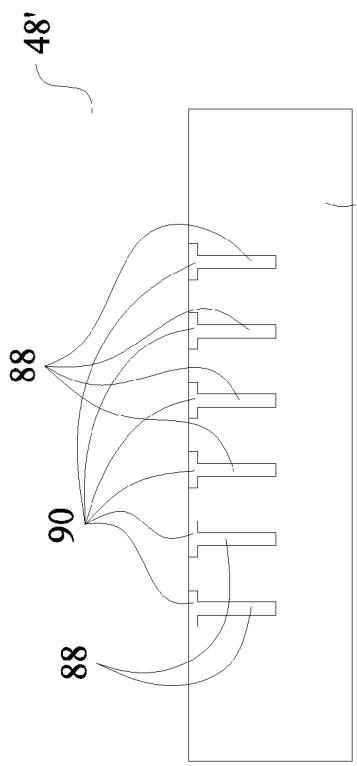
FIG. 39
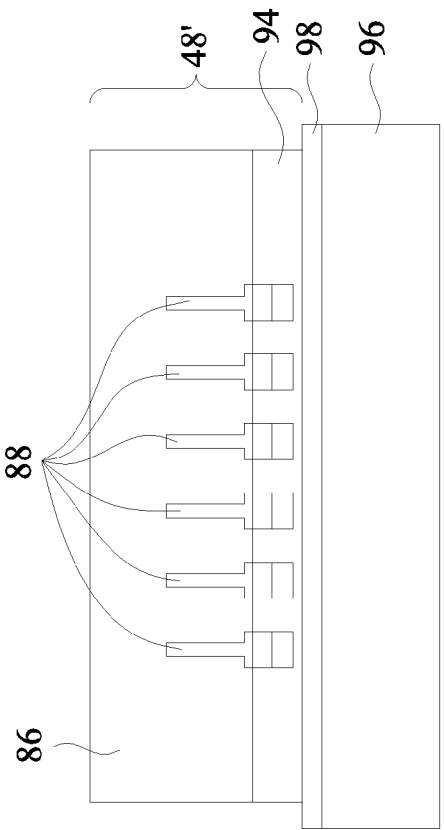
FIG. 40

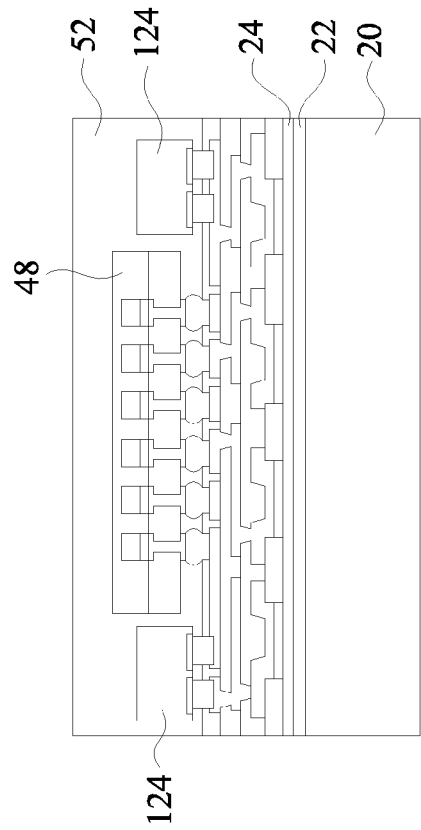
FIG. 57
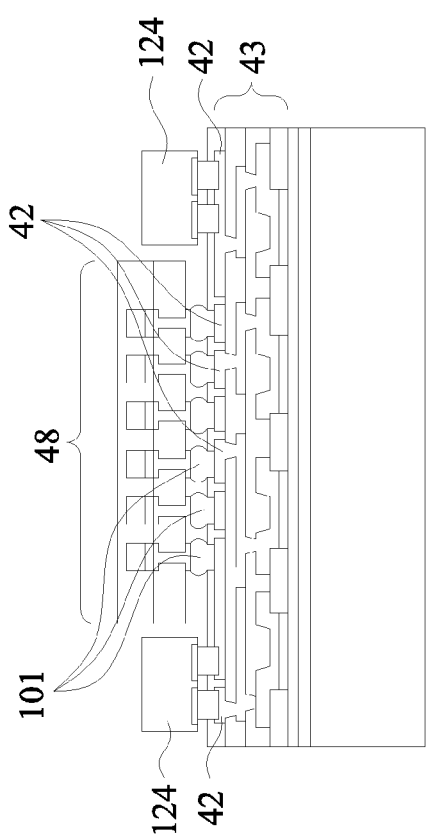
FIG. 58
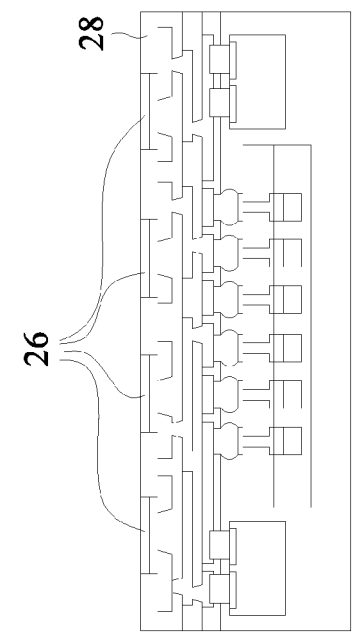
FIG. 59
FIG. 60

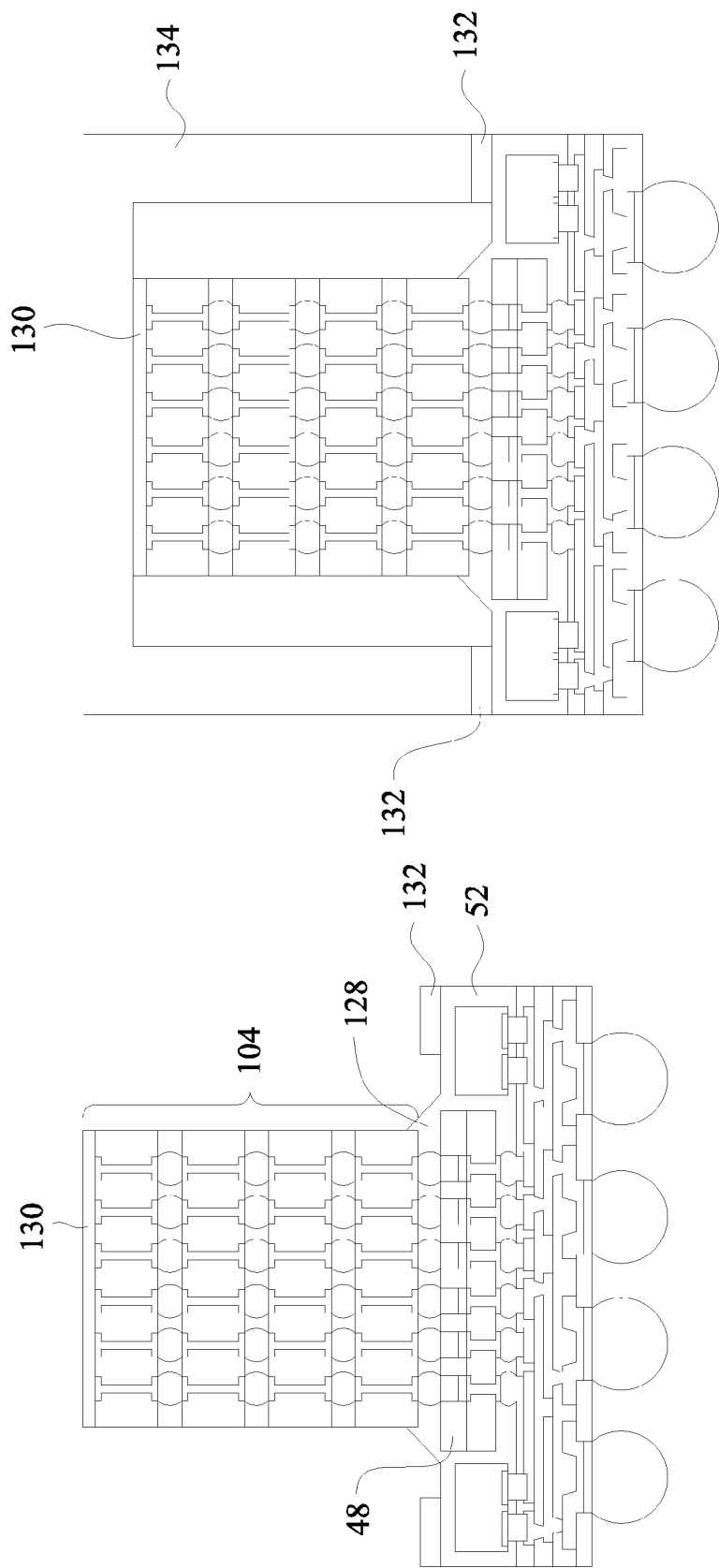

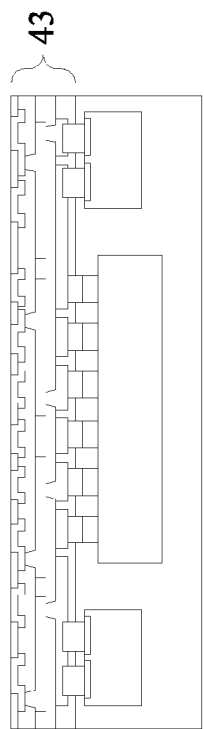
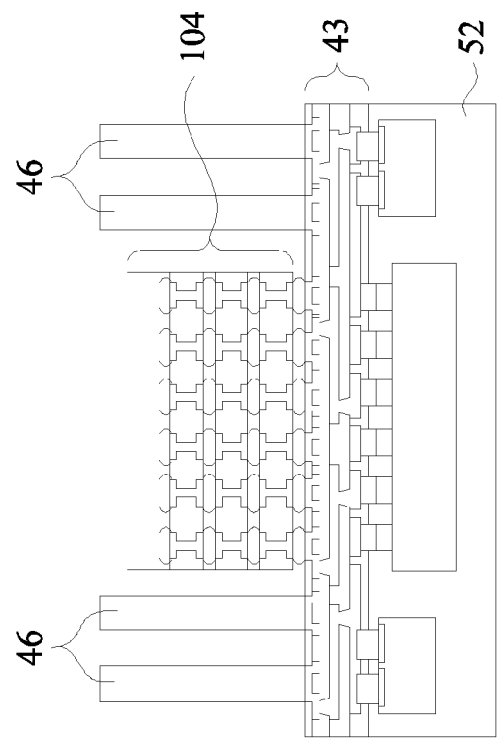
FIG. 73
FIG. 74
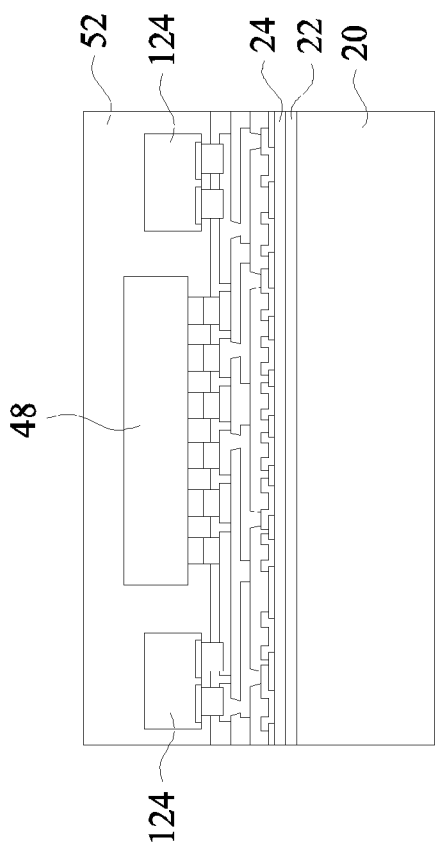
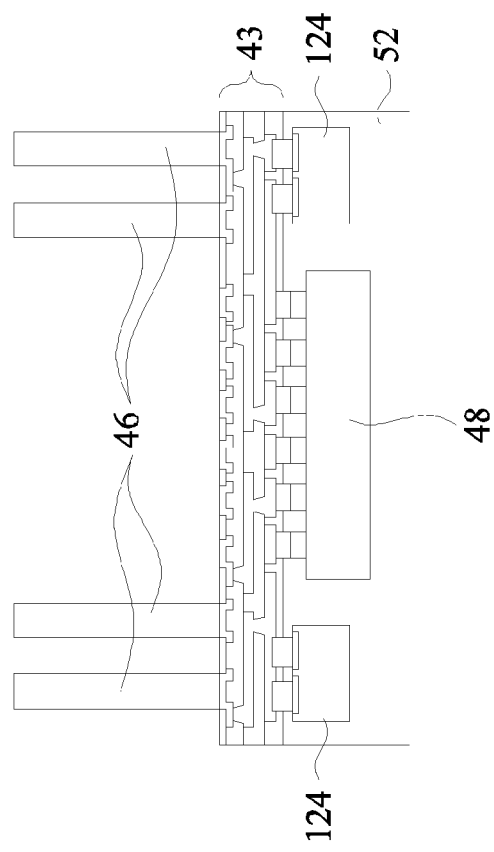
FIG. 75
FIG. 76

RDL-FIRST PACKAGING PROCESS

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded for expanding the integration ability of the packages, is developed. With a high degree of integration, the electrical performance of the resulting PoP package is improved due to the shortened connecting paths between components. By using PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12 are cross-sectional views of intermediate stages in the manufacturing of packages in accordance with some embodiments;

FIGS. 34 through 36 are cross-sectional views of Package-on-Package (PoP) structures in accordance with some embodiments;

FIGS. 37 through 44 are cross-sectional views of intermediate stages in the formation of device dies in accordance with some embodiments;

FIGS. 53 through 68 are cross-sectional views of intermediate stages in the manufacturing of packages in accordance with some embodiments; and FIGS. 69 through 84 are cross-sectional views of intermediate stages in the manufacturing of packages in accordance with some embodiments.

DETAILED DESCRIPTION

Figure 5:
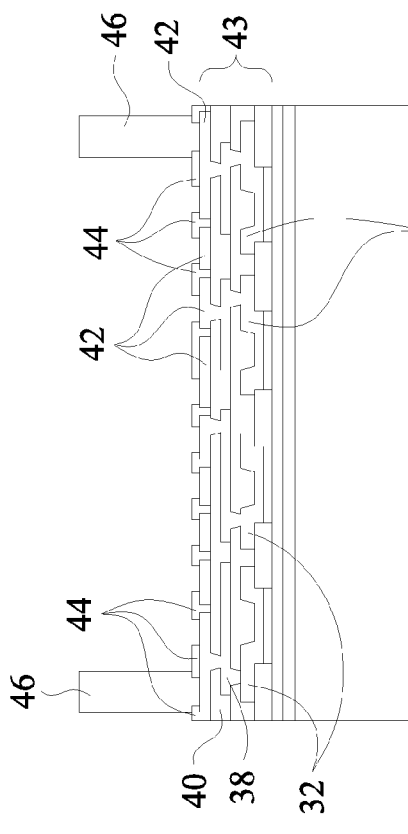

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages and the methods of forming the same are provided in accordance with various embodiments. The intermediate stages of forming the packages are illustrated. The variations of the embodiments are discussed. Throughout the various views and illustrative embodiments, like reference numbers are used to designate like elements.

FIGS. 1 through 12 illustrate the cross-sectional views of intermediate stages in the manufacturing of a package in accordance with embodiments. FIG. 1 illustrates carrier 20 and release layer 22 formed on carrier 20. Carrier 20 may be a glass carrier, a ceramic carrier, or the like. Carrier 20 may have a round top-view shape and may be a size of a silicon wafer. For example, carrier 20 may have an 8-inch diameter, a 12-inch diameter, or the like. Release layer 22 may be formed of a polymer-based material, which may be removed along with carrier 20 from the overlying structures that will be formed in subsequent steps. In an embodiment, release layer 22 is formed of an epoxy-based thermal-release material. In other embodiments, release layer may be formed of a ultra-violet (UV) glue. Release layer 22 may be dispensed as a liquid and cured. In alternative embodiments, release layer 22 is a laminate film and is laminated onto carrier 20. The top surface of release layer 22 is leveled and has a high degree of co-planarity.

Seed layer 24 is formed over release layer 22. In some embodiments, seed layer 24 is a metal layer, which may be a single layer or a composite layer comprising a plurality of sub-layers formed of different materials. In some embodiments, seed layer 24 comprises a titanium layer and a copper layer over the titanium layer. Seed layer 24 may be formed using, for example, Physical Vapor Deposition (PVD).

Referring to FIG. 2, dielectric layer 28 is formed on seed layer 24. The bottom surface of dielectric layer 28 may be in contact with the top surface of seed layer 24. In some embodiments, dielectric layer 28 is formed of a polymer, which may be a photo-sensitive material such as polybenzoxazole (PBO), polyimide, benzocyclobutene (BCB), or the like, that may be easily patterned using a lithography mask. In alternative embodiments, dielectric layer 28 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 28 is then patterned to form openings 30 therein. Hence, seed layer 24 is exposed through the openings 30 in dielectric layer 28.

Next, Under-Bump Metallurgies (UBMs) 26 are formed in openings 30. In accordance with some embodiments, UBMs 26 are formed through plating, which may be electroless plating in some embodiments. UBMs 26 may comprise nickel layers or composite layers including nickel layers and copper layers over the nickel layers.

Next, referring to FIG. 3, Redistribution Lines (RDLs) 32 are formed. RDLs 32 may include lower portions 32A whose bottoms contact UBMs 26 and upper portions 32B whose bottom surfaces contact the top surface of dielectric layer 28. In accordance with some exemplary embodiments, the formation of RDLs 32 includes the forming of a blanket seed layer (not shown), the forming and patterning of a photo resist (not shown) to cover portions of the blanket seed layer, and the plating of a metallic material to form RDLs 32. The portions of the blanket seed layer not covered by RDLs 32 are then removed. RDLs 32 may be formed of copper, aluminum, tungsten, or the like. As shown in FIG. 3, RDLs 32 have recesses 34 therein, wherein the recess faces upwardly.

FIG. 4 illustrates the formation of dielectric layer 36 and RDLs 38. Dielectric layer 36 may be a polymer layer such as PBO, and its materials may be selected from the same candidate materials as for dielectric layer 28. Next, RDLs 38 are formed to electrically couple to the underlying RDLs 32 through the openings in dielectric layer 36. The formation of RDLs 38 may be the same as the formation of RDLs 32.

FIG. 5 illustrates the formation of dielectric layer 40 and RDLs 42. The material for dielectric layer 40 may be selected from the same candidate materials as for dielectric layers 28 and/or 36. Next, RDLs 42 are formed to electrically couple to the underlying RDLs 38 through the openings in dielectric layer 40. The formation of RDLs 42 may be the same as the formation of RDLs 32 and/or 38.

Figure 6:
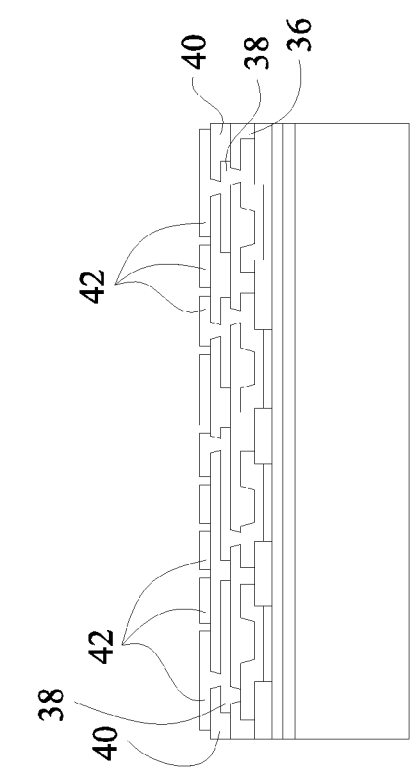

Referring to FIG. 6, dielectric layer 44 is formed to cover portions of RDLs 42 and dielectric layer 40. Similarly, the material for dielectric layer 44 may be selected from the same candidate materials as for dielectric layers 28, 36, and/or 40. Through-vias 46 are formed over RDLs 42 and electrically connect to some of RDLs 42. Throughout the description, the RDLs 32, 38, and 42 as shown in FIG. 6 in combination are referred to as front-side RDLs 43.

The formation process of through-vias 46 may include the forming of a photo-sensitive material (not shown) over RDLs 42 and dielectric layer 44, the performing of a lithography process to form openings (not shown) in the photo-sensitive material, and the plating of a metallic material into the openings. After removing the photo-sensitive material, the remaining plated metallic material becomes through-vias 46. Through-via 46 is formed of a non-solder metallic material such as copper, aluminum, tungsten, or the like.

Figure 7:
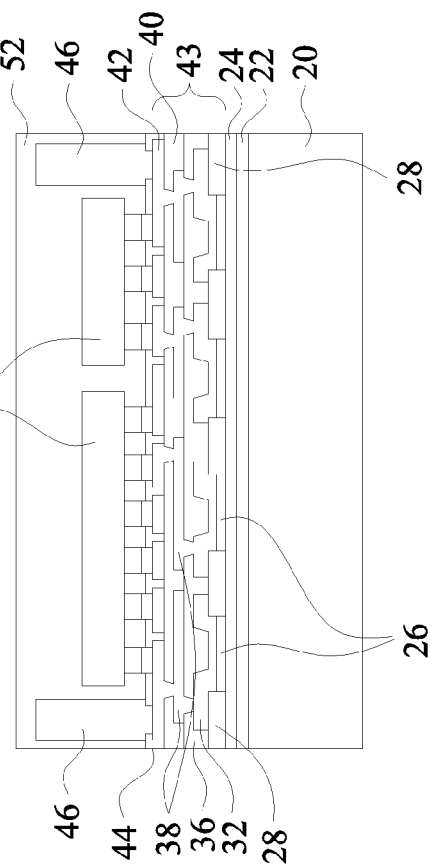

Next, referring to FIG. 7, device dies 48 are bonded to the exposed portions of RDLs 42 through flip-chip bonding. In accordance with some embodiments of the present disclosure, the flip-chip bonding comprises solder bonding, wherein solder regions 50 are used. In the reflow of solder regions 50 to bond device dies 48 to front-side RDLs 43, device dies 48 are self-aligned to their intended positions due to the pulling force of the molten solder regions 50. Accordingly, the alignment of device dies 48 is improved.

Figure 8:
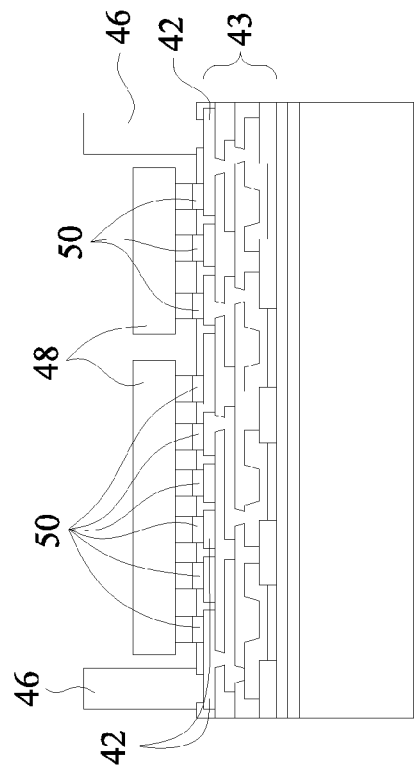

FIG. 8 illustrates the molding of device dies 48 and through-vias 46 in molding material 52. Molding material 52 may be a polymer-comprising material and may be a molding compound, a molding underfill, an epoxy, or the like. Molding material 52 may be applied in a liquid form, which is dispensed and then cured. The top surface of molding material 52 is higher than the top surfaces of through-vias 46.

An advantageous feature of the embodiments of the present disclosure is that front-side RDLs 43 are formed before the molding process. Since molding material 52 typically applies high stress to surrounding structures, if front-side RDLs 43 are formed after the molding process, the stress causes the locations of RDLs 43 to shift, and hence it is difficult to do overlay alignment. As a result, it is difficult to reduce the line widths of RDLs 43 without incurring overlay alignment problem. Accordingly, the embodiments of the present disclosure have improved alignment by forming RDLs 43 before the molding process.

Next, a carrier de-bonding is performed to detach (de-bond) carrier 20 from the overlying structure. In accordance with some embodiments, the de-bonding includes projecting a light such as a laser light or an UV light on release layer 22 so that release film 22 decomposes under the heat of the light and carrier 20 can be removed. Seed layer 24 is then removed, for example, in a grinding process. The resulting structure is shown in FIG. 9.

Figure 9:
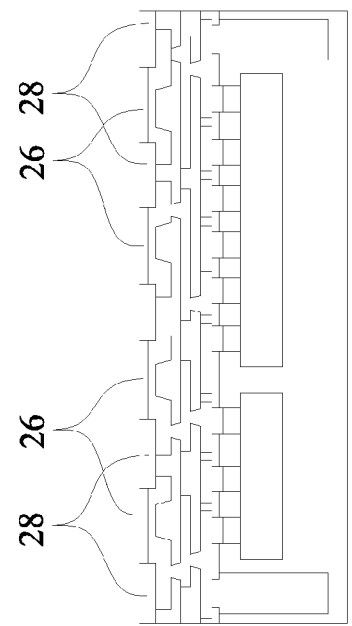
Figure 10:
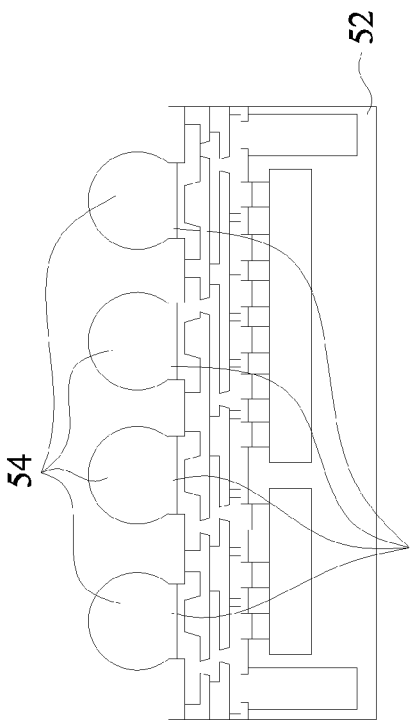

As shown in FIG. 9, the illustrated structure has a planar top surface, which includes the top surfaces of UBMs 26 and dielectric layer 28. Next, as shown in FIG. 10, solder balls 54 are formed to connect to UBMs 26. In some embodiments, forming solder ball 54 includes placing solder balls on UBMs 26 and then performing a reflow. In alternative embodiments, forming solder balls 54 includes plating solder on UBMs 26 and then reflowing the plated solder.

Figure 11:
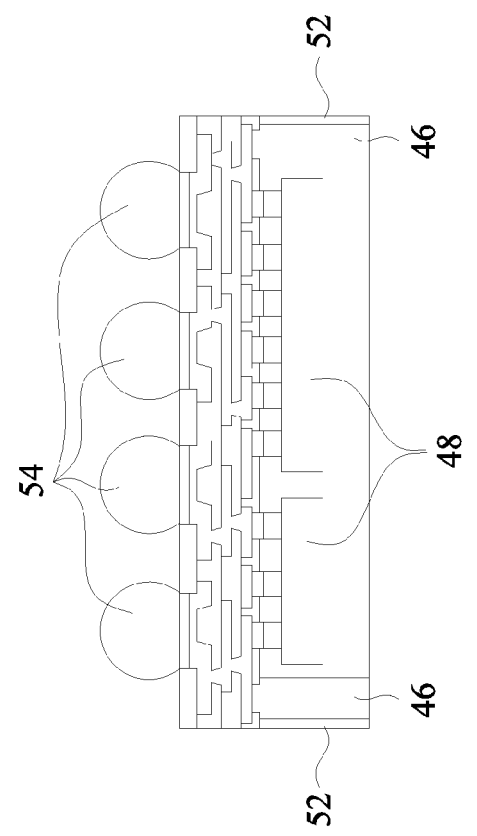

In a subsequent step, as shown in FIG. 11, a grinding process is performed to remove excess portions of molding material 52 so that the surfaces of through-vias 46 are coplanar with a surface of molding material 52. Through-vias 46 are accordingly revealed. Device dies 48 may be embedded in molding material 52 and not revealed. In alternative embodiments, the grinding is performed until the back surfaces (for example, the surface of the silicon substrates in device dies 48) of device dies 48 are revealed.

Figure 12:
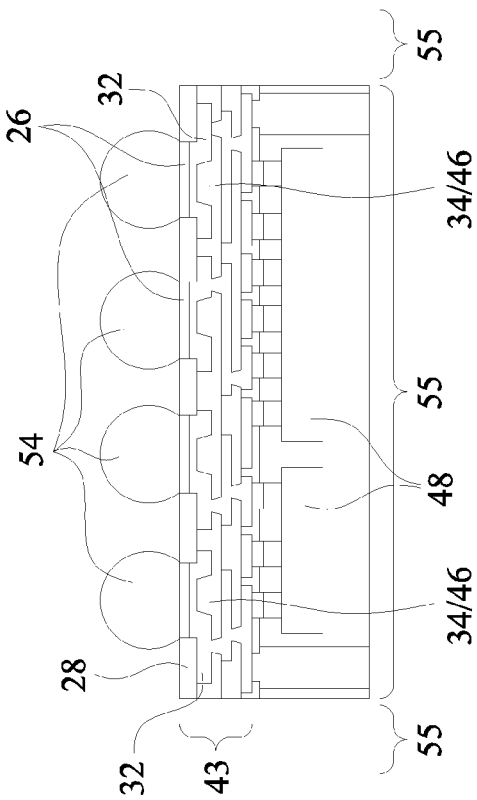

FIG. 12 illustrates the singulation of the structure in FIG. 11, wherein the singulation includes a die-sawing step. The singulation results in the formation of a plurality of packages that are identical to the illustrated package 55. In some embodiments, package 55 includes front-side RDLs 43, which are between solder balls 54 and device dies 48. Since RDLs 32 are formed before the attachment of device dies 48, as shown in FIG. 3, recesses 34 (FIGS. 3 and 12) in RDLs 32 face device dies 48. Recesses 34 are filled with dielectric layer 36.

FIGS. 13 through 17 illustrate cross-sectional views of intermediate stages in the formation of packages in accordance with alternative embodiments. Unless specified otherwise, the materials and the formation methods of the components in these embodiments are essentially the same as their like components, which are denoted by like reference numerals in the embodiments shown in FIGS. 1 through 12. The details regarding the formation process and the materials of the components shown in FIGS. 13 through 17 (and also in FIGS. 18 through 84) may thus be found in the discussion of the embodiments shown in FIGS. 1 through 12.

Figure 13:
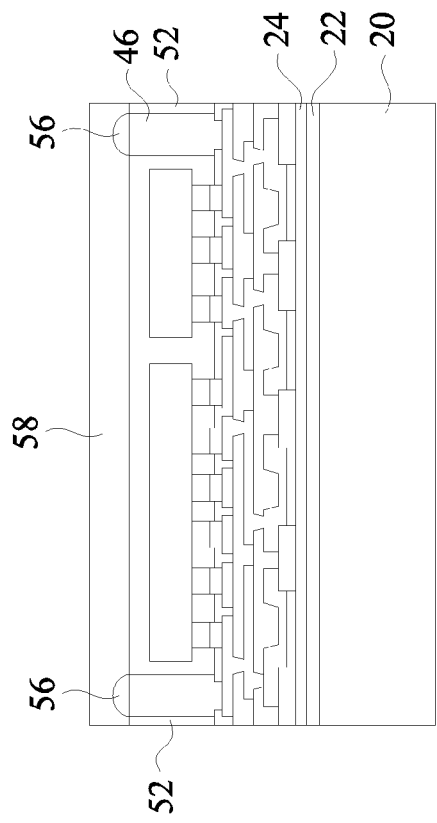
FIGS. 13 through 17 are cross-sectional views of intermediate stages in the manufacturing of packages in accordance with some embodiments.

The embodiments in FIGS. 13 through 17 are similar to the embodiments in FIGS. 1 through 12, except solder regions are formed on through-vias 46. The initial steps of these embodiments are essentially the same as shown in FIGS. 1 through 8. The materials and the process details in FIGS. 1 through 8 are not repeated herein. Next, as shown in FIG. 13, a grinding process is performed to reveal through-vias 46. Accordingly, the top surfaces of through-vias 46 are revealed and are coplanar with the top surface of molding material 52. Furthermore, a laser marking step may be performed on molding material 52 to form identification marks (not shown).

Figure 14:
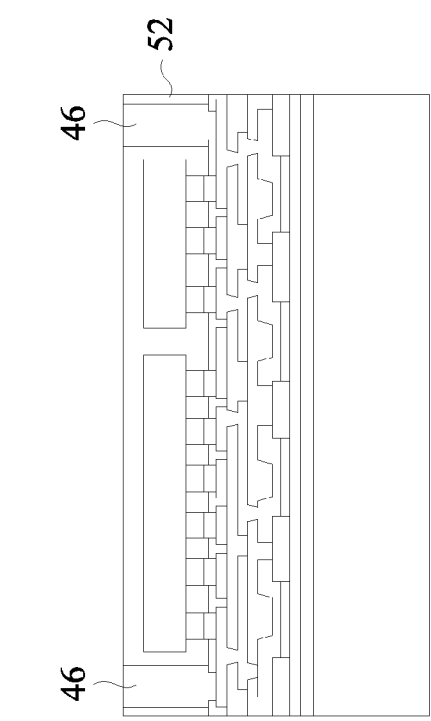

FIG. 14 illustrates the formation of solder regions 56 on the surfaces of through-vias 46. In some embodiments, solder regions 56 are formed through selective plating on exposed through-vias 46, followed by a reflow. Tape 58 is then attached to through-vias 46 and solder regions 56. Tape 58 may be a thermal-resistant tape that can endure the temperature of the subsequent reflow of solder regions.

Figure 15:
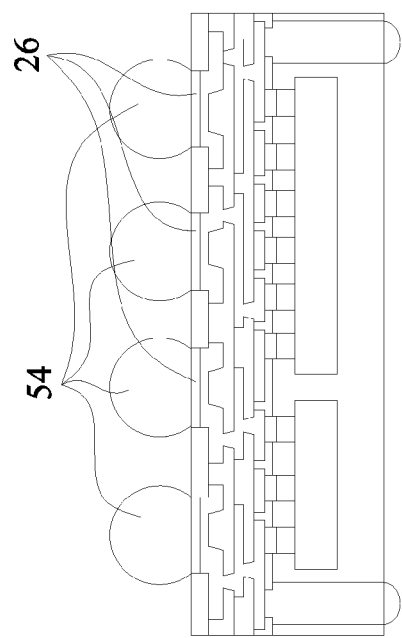
Figure 16:
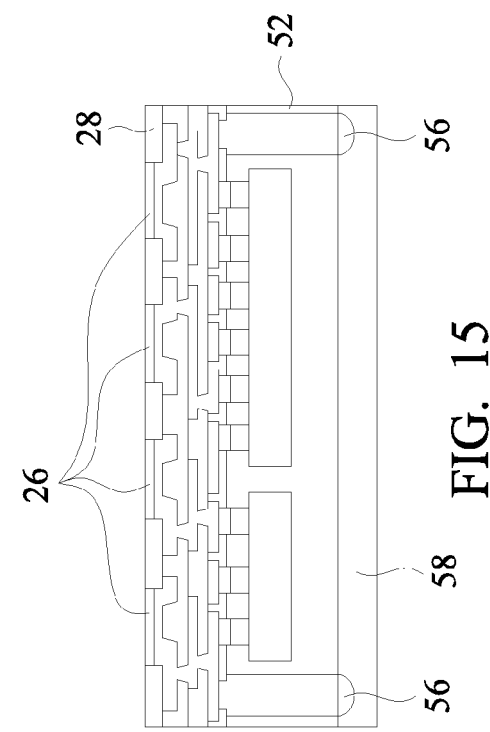
Figure 17:
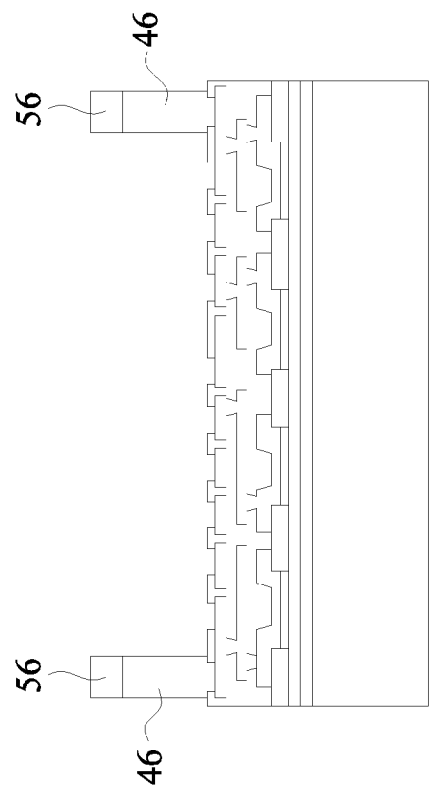
Figure 18:
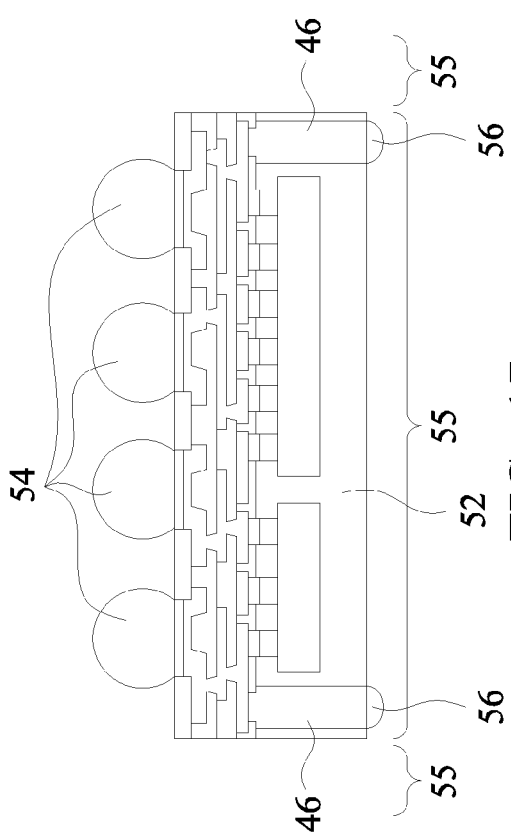
FIGS. 18 through 24 are cross-sectional views of intermediate stages in the manufacturing of packages in accordance with some embodiments.

Next, carrier 20 is demounted, and seed layer 24 is removed. The resulting structure is shown in FIG. 15. In subsequent process steps, solder balls 54 are formed on UBMs 26 (FIG. 16), followed by a singulation step to saw the wafer-level package into packages 55, as shown in FIG. 17. In the resulting package, solder regions 56 protrude beyond a planar surface of molding material 52.

FIGS. 18 through 24 illustrate the cross-sectional views of intermediate stages in the formation of packages in accordance with alternative embodiments. These embodiments are similar to the embodiments in FIGS. 13 through 17, except solder regions on through-vias are formed before the molding step. The initial steps of these embodiments are similar to what are shown in FIGS. 1 through 6, except solder regions 56 are also plated on through-vias 46. Solder regions 56 and through-vias 46 may be plated using the same mask (such as a photo resist, not shown). Accordingly, the sidewalls of solder regions 56 and through-vias 46 are aligned. Furthermore, the top surfaces of solder regions 56 may be planar.

Figure 19:
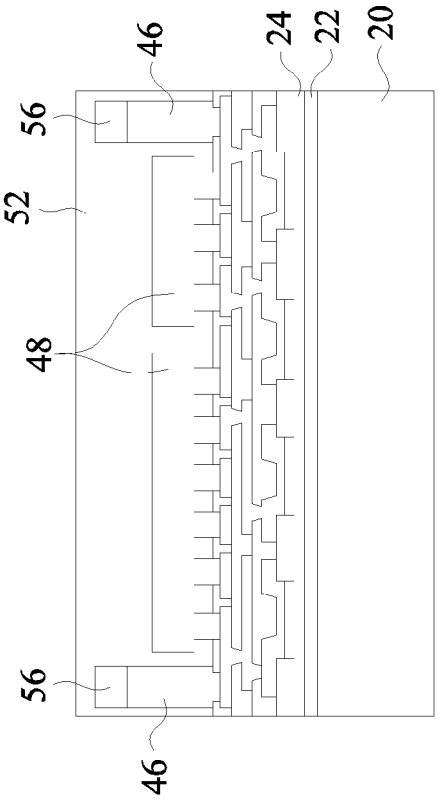
Figure 20:
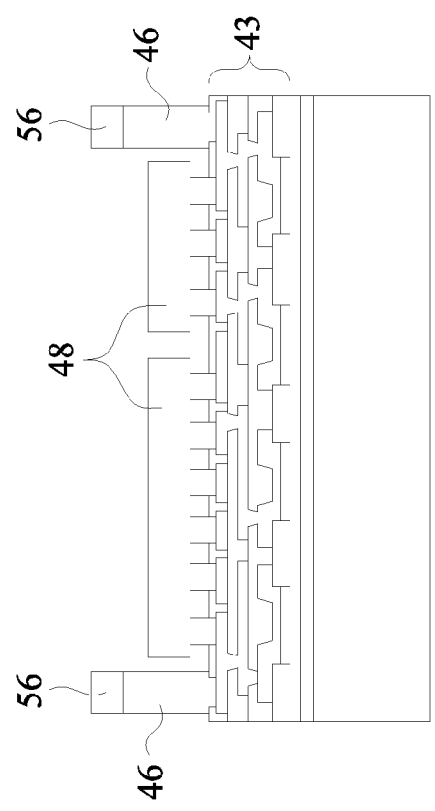
Figure 21:
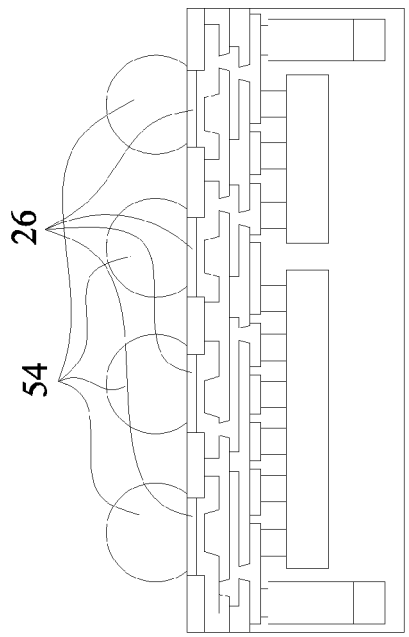
Figure 22:
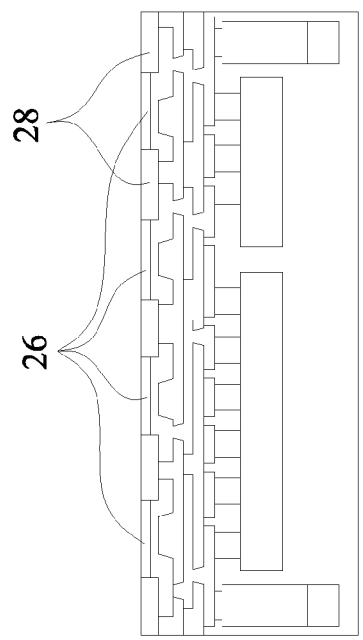
Figure 23:
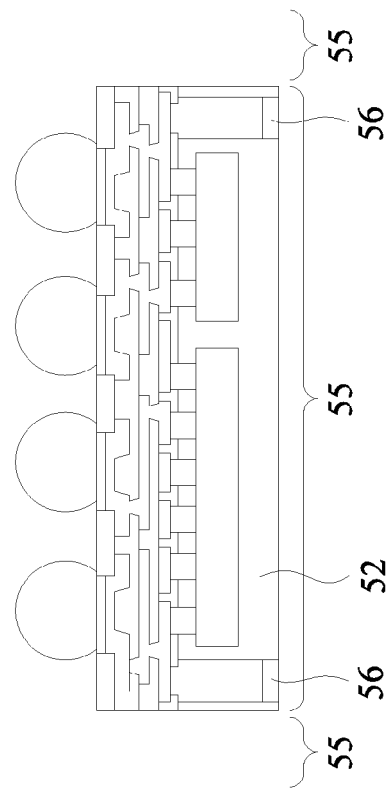
Figure 24:
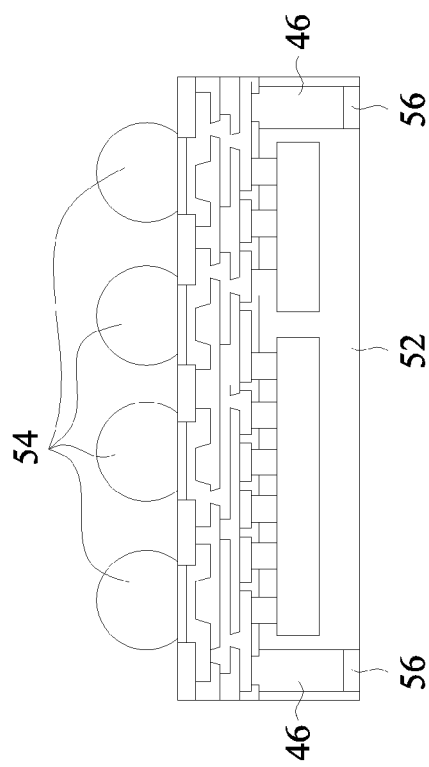

Next, device dies 48 are bonded to front-side RDLs 43, as shown in FIG. 19, followed by the molding of solder regions 56, through-vias 46, and device dies 48 in molding material 52. The resulting structure is shown in FIG. 20. Carrier 20 is then removed by decomposing release layer 22. Seed layer 24 is also removed, and the resulting structure is shown in FIG. 21. Next, referring to FIG. 22, solder balls 54 are formed on UBMs 26. A grinding process is then performed to expose solder regions 56, and hence the structure in FIG. 23 is formed. The resulting solder regions 56 may have surfaces coplanar with a surface of molding material 52. In a subsequent step, as shown in FIG. 24, a singulation step is performed to form packages 55. In these embodiments, in packages 55, solder regions 56 are embedded in molding material 52, with the surfaces of solder regions 56 coplanar with a surface of molding material 52.

In the packages formed in the steps shown in FIGS. 1 through 24, single-side RDLs are formed, wherein RDLs are formed on one side, and not on the other side, of the molding material and device dies. FIGS. 25 through 33 illustrate cross-sectional views of intermediate stages in the formation of packages in accordance with alternative embodiments wherein double-side RDLs are formed on opposite sides of the molding material and device dies.

Figure 25:
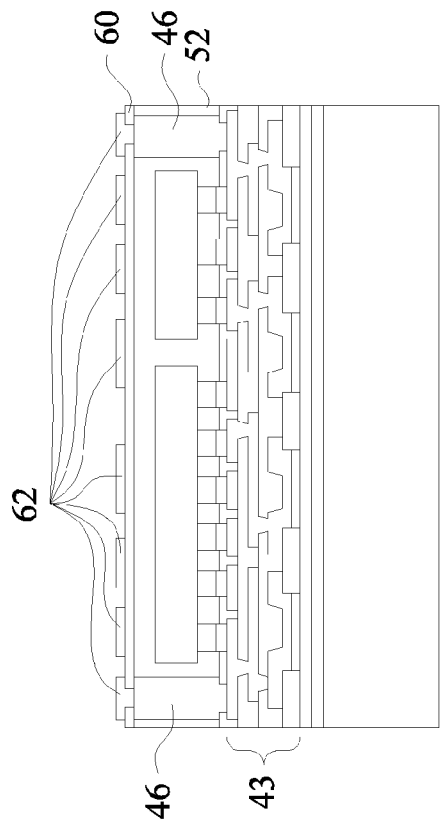
FIGS. 25 through 33 are cross-sectional views of intermediate stages in the manufacturing of packages in accordance with some embodiments.
Figure 26:
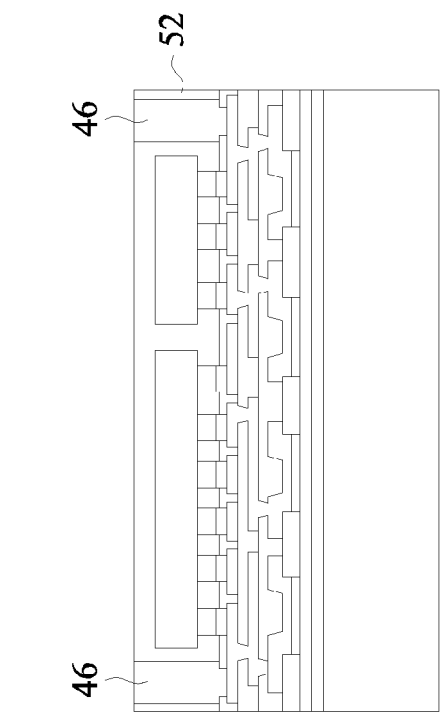

The initial steps of these embodiments are similar to what are shown in FIGS. 1 through 8. Next, as shown in FIG. 25, a grinding process is performed on molding material 52 and through-vias 46 so that through-vias 46 are exposed. Next, as shown in FIG. 26, dielectric layer 60 and backside RDLs 62 are formed, wherein backside RDLs 62 comprise vias penetrating through dielectric layer 60 to electrically connect to through-vias 46. The material for dielectric layer 60 may be selected from the same candidate materials as for the dielectric layers in front-side RDLs 43.

Figure 27:
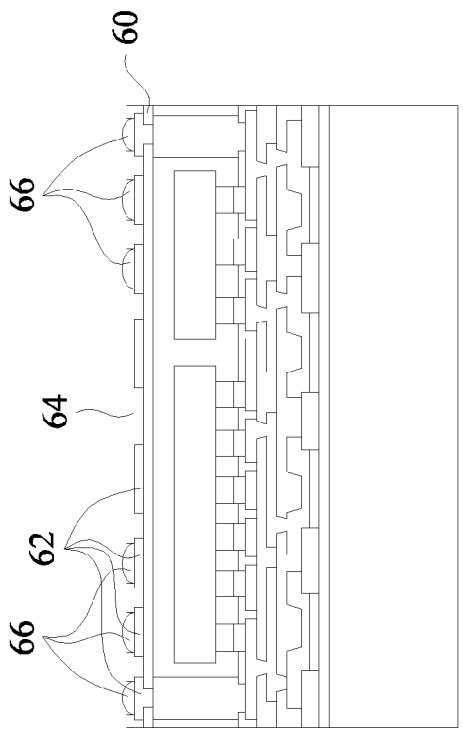
Figure 28:
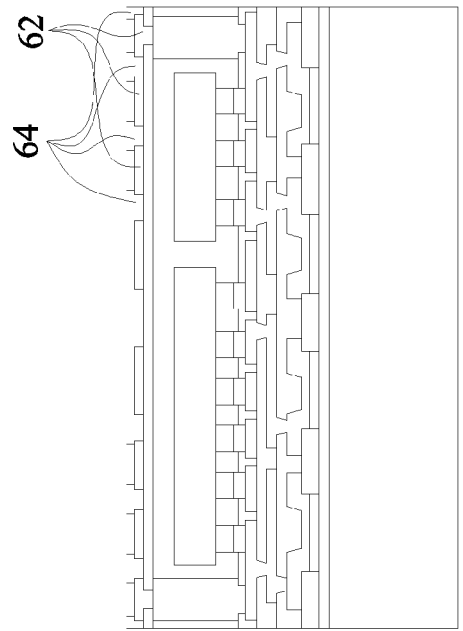

In FIG. 27, dielectric layer 64 is formed, wherein dielectric layer 64 may be formed of a polymer such as PBO, but other dielectric materials may also be used. Portions of RDLs 62 are exposed through the openings in dielectric layer 64. Next, referring to FIG. 28, solder regions 66 are formed on the exposed portions of RDLs 62. It is appreciated that although FIG. 28 illustrates one layer of backside RDL, more layers of backside RDLs may be formed.

Figure 29:
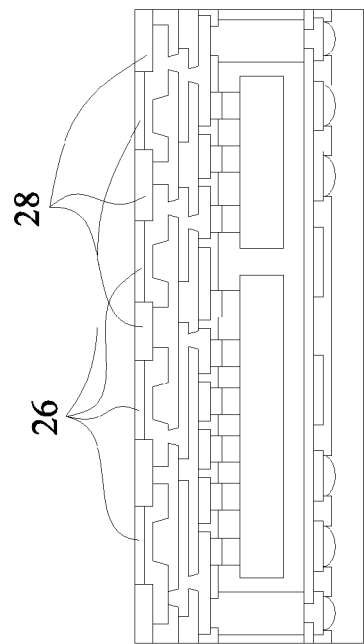
Figure 30:
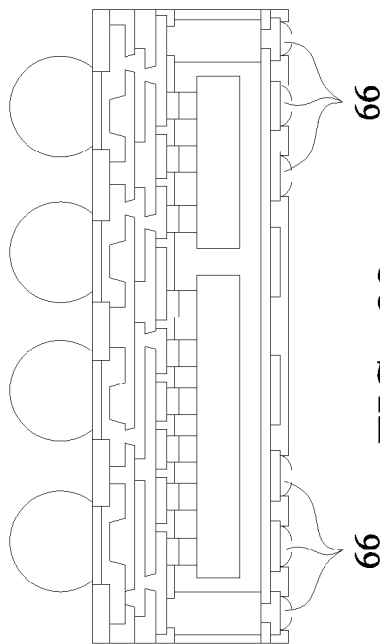

FIG. 29 illustrates the taping process, wherein tape 58 is attached to solder regions 66 and dielectric layer 64. Carrier 20 is then removed by, for example, decomposing release layer 22, followed by the removal of seed layer 24. The resulting structure is shown in FIG. 30.

Figure 31:
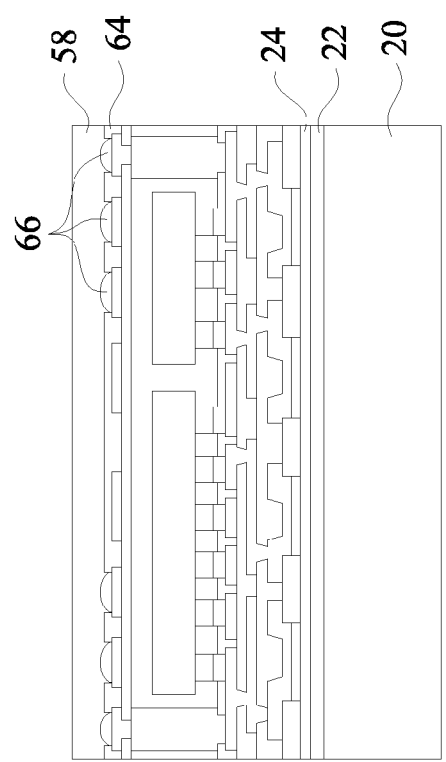
Figure 32:
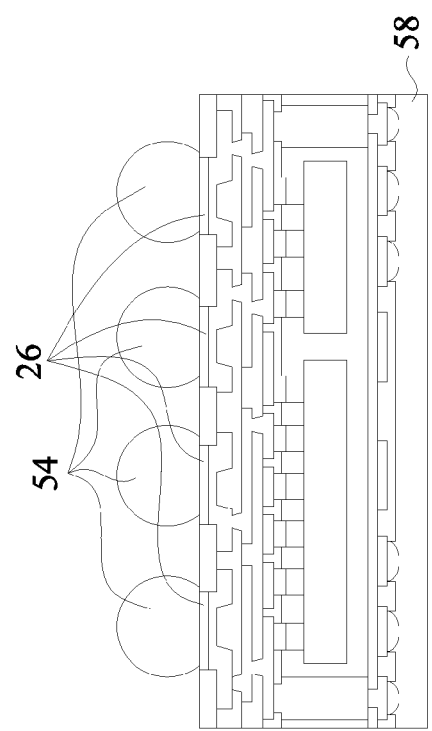
Figure 33:
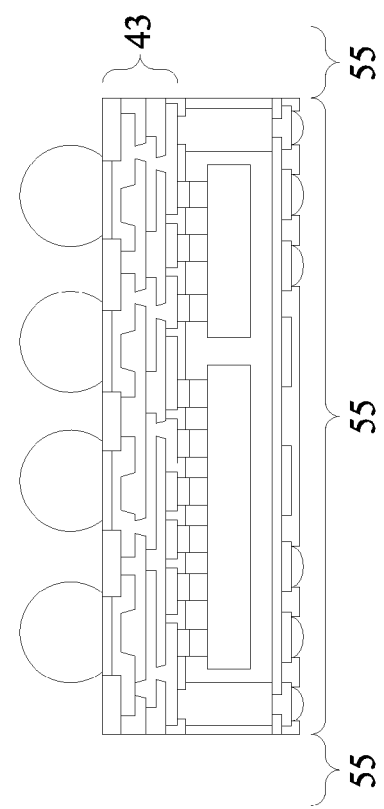

Next, as shown in FIG. 31, solder regions 54 are formed to connect to UBMs 26. Tape 58 is then removed, as shown in FIG. 32, followed by a singulation step, as shown in FIG. 33. As a result of the singulation, a plurality of packages 55 is formed.

Figure 34:
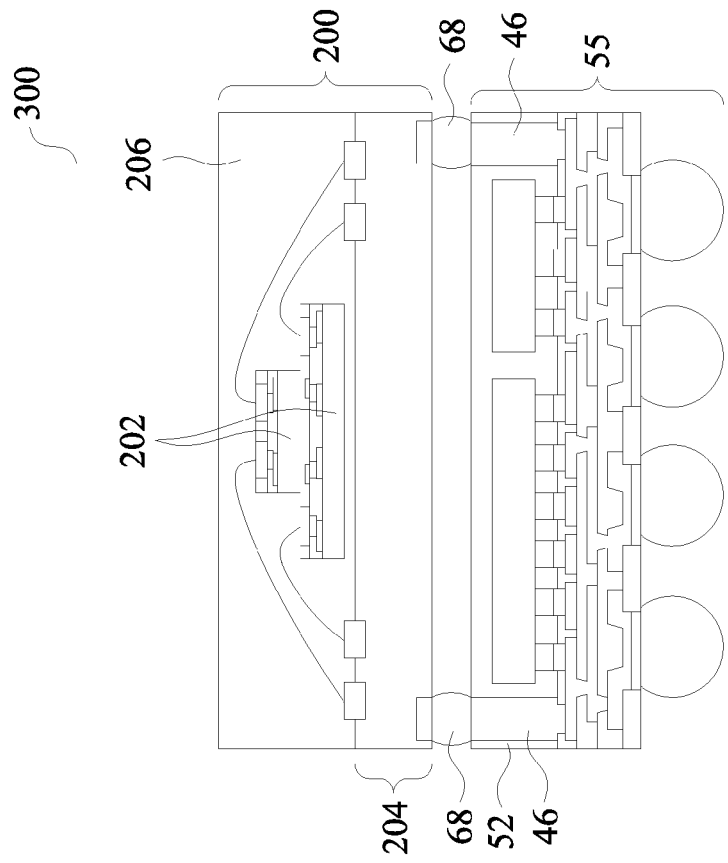

FIGS. 34, 35, and 36 illustrate the packages (Package-on-Package (PoP) structures) including packages 55 and the packages 200 bonded to packages 55. In FIGS. 34, 35, and 36, package 200 (also referred to as top packages) includes dies 202, which may be memory dies, logic dies, or the like. Device dies 202 are mounted on package substrate 204 and are molded in molding material 206. The resulting structures are referred to as PoP structures 300.

The PoP structure 300 in FIG. 34 is formed by bonding the package 55 in FIG. 12 or FIG. 17 with package 200. In the resulting structure, the top surface of molding material 52 is coplanar with the top surfaces of through-vias 46. The top surfaces of through-vias 46 are further in contact with solder regions 68, which bonds package 55 to package 200.

The PoP structure 300 in FIG. 35 is formed by bonding the package 55 in FIG. 24 to package 200. In the resulting structure, the top surface of molding material 52 is higher than the top surfaces of through-vias 46. The top surfaces of through-vias 46 are further in contact with solder regions 68, which extend into molding material 52.

The PoP structure 300 in FIG. 36 is formed by bonding the package 55 in FIG. 33 to package 200, wherein package 55 includes RDLs on both sides of molding material 52.

FIG. 37 through FIG. 84 illustrate the cross-sectional views in the formation of packages in accordance with alternative embodiments. FIGS. 37 through 44 illustrate the formation of device dies 48 (FIG. 44), and FIGS. 45 through 52 illustrate the formation of memory cubes 104 (FIG. 52), wherein device dies 48 and memory cubes 104 are used in the package formation process shown in FIGS. 53 through 68 and in the package formation process shown in FIGS. 69 through 84.

Referring to FIG. 37, an initial structure of wafer 48' is provided. Wafer 48' includes semiconductor substrate 86, through-vias 88 extending into semiconductor substrate 86, and metal pads 90 over semiconductor substrate 86. For simplicity, some details of wafer 48' are not shown. For example, the un-illustrated features in wafer 48' may include transistors, interconnect structures such as dielectric layers, metal lines and vias, and the like. The un-illustrated features may include the features at the surface of semiconductor substrate 86 and the features over semiconductor substrate 86. The un-illustrated features may be underlying metal pads 90.

In FIG. 38, metal pillars 92 are plated on the top surfaces of metal pads 90. Metal pillars 92 may be solder pillars, which may further be lead-free solder pillars, for example. Alternatively, metal pillars 92 are copper pillars. In yet other embodiments, metal pillars 92 include non-solder metal pillars (such as copper pillars) and solder pillars over the non-solder metal pillars. Next, referring to FIG. 39, dielectric layer 94 is formed to cover metal pillars 92, wherein dielectric layer 94 covers the top surfaces of metal pillars 92. Dielectric layer 94 may be a polymer layer such as a PBO layer.

Figure 42:
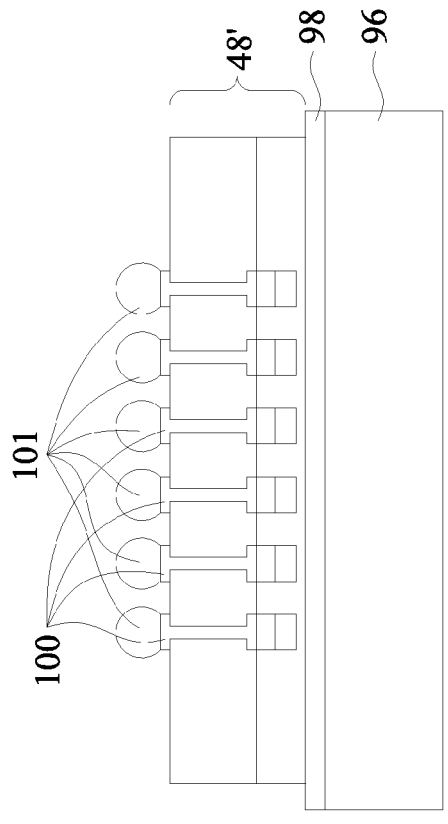
Figure 41:
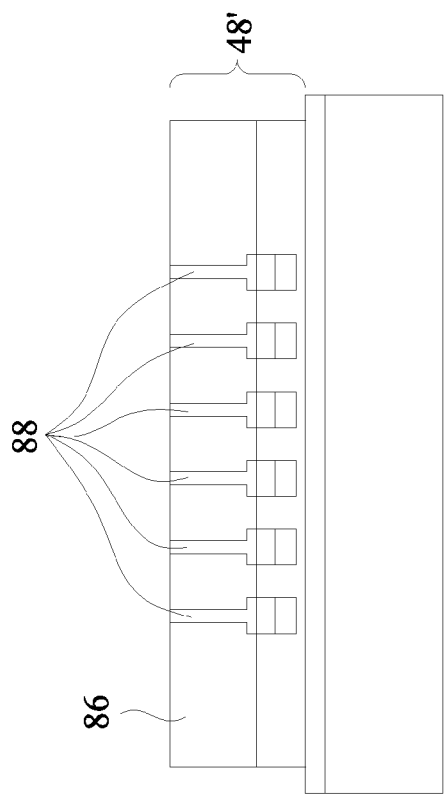
Figure 44:
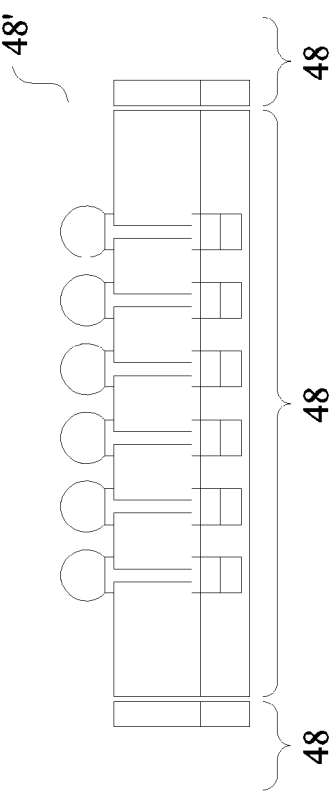
Figure 43:
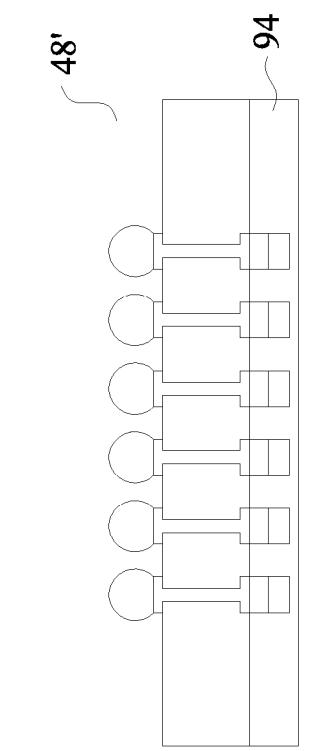

FIG. 40 illustrates that wafer 48' is attached to carrier 96, for example, through adhesive 98, with substrate 86 exposed. Next, a grinding process is performed to remove an excess portion of semiconductor substrate 86, until through-vias 88 are exposed, as shown in FIG. 41. In subsequent steps, metal pads 100 are formed, followed by the formation of solder regions 101, as shown in FIG. 42. Carrier 96 is then removed, for example, by decomposing adhesive 98, with the resulting structure being shown in FIG. 43. In FIG. 44, a singulation is performed to saw wafer 48' into a plurality of device dies 48 that are identical to each other.

Figure 45:
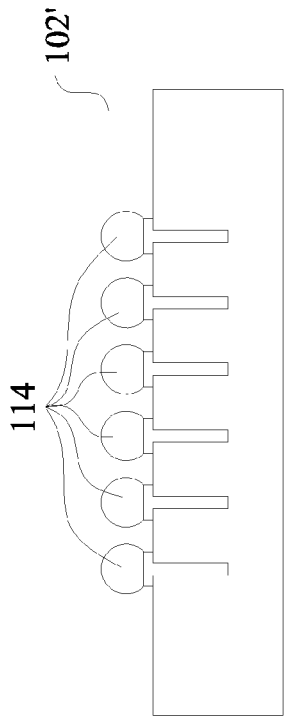
FIGS. 45 through 52 are cross-sectional views of intermediate stages in the formation of Hybrid Memory Cubes (HMCs) in accordance with some embodiments.

Referring to FIG. 45, an initial structure of wafer 102' is provided. Wafer 102' includes semiconductor substrate 108, through-vias 110 extending into semiconductor substrate 108, and metal pad 112 over semiconductor substrate 108. For simplicity, some details of wafer 102' are not shown. For example, the un-illustrated features in wafer 102' may include transistors, interconnect structures such as dielectric layers, metal lines and vias, and the like. The un-illustrated features may include the features at the surface of semiconductor substrate 108 and the features over semiconductor substrate 108. The un-illustrated features may be underlying metal pads 112.

Figure 46:
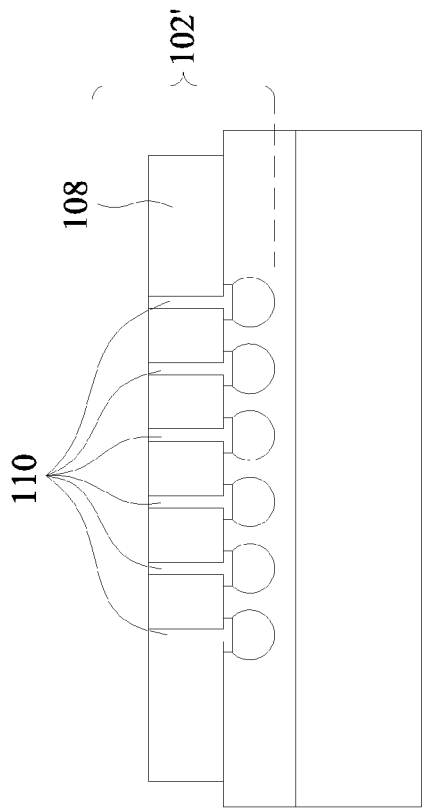
Figure 47:
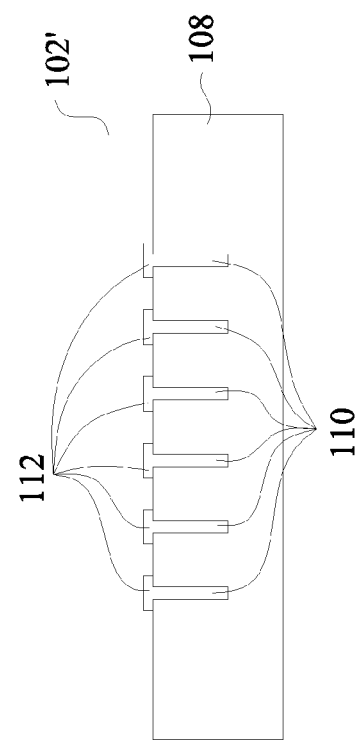
Figure 48:
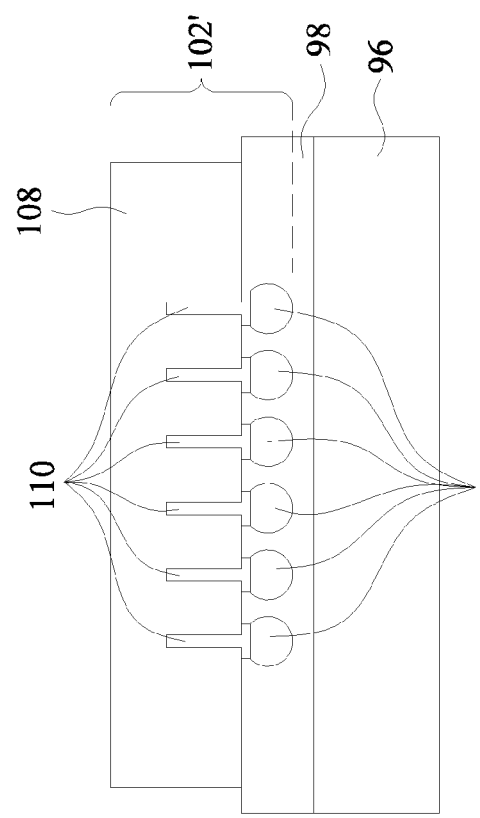
Figure 50:
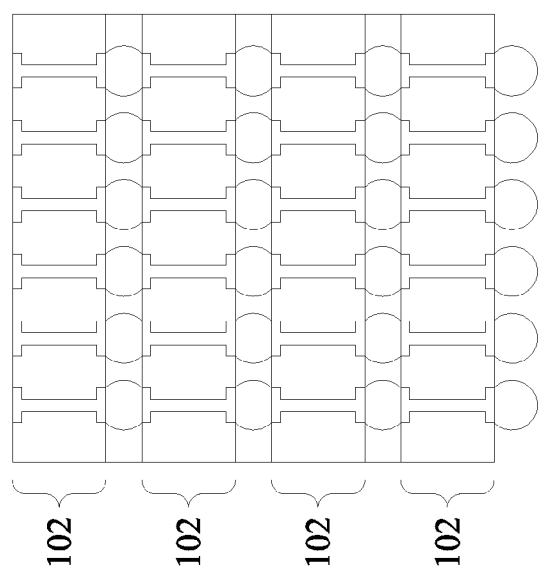
Figure 49:
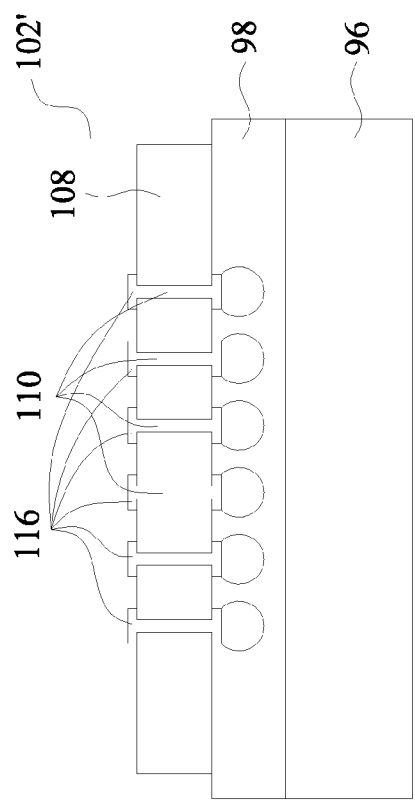
Figure 51:
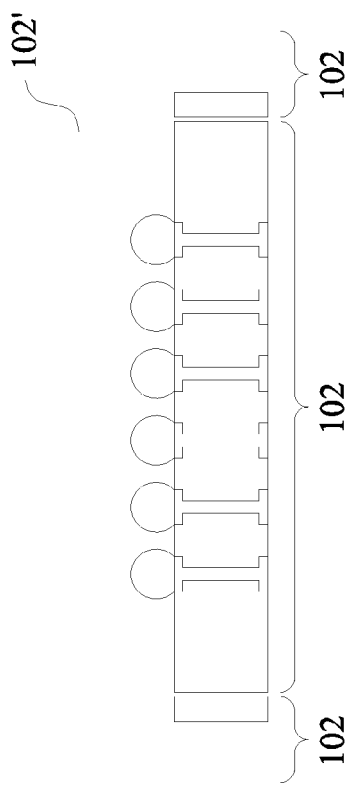

In FIG. 46, solder regions 114 are formed on the top surfaces of metal pads 112, for example, through ball placement and reflowing. Next, referring to FIG. 47, wafer 102' is attached to carrier 96, for example, through adhesive 98, with substrate 108 being exposed. Next, a grinding is performed to remove an excess portion of semiconductor substrate 108, until through-vias 110 are exposed, as shown in FIG. 48. In subsequent steps, as shown in FIG. 49, metal pads 116 are formed. In a subsequent step, solder regions 118 are formed, as shown in FIG. 50. Carrier 96 (FIG. 49) is then removed, for example, by decomposing adhesive 98, with the resulting structure also shown in FIG. 50. In FIG. 51, a singulation is performed to saw wafer 102' into a plurality of device dies 102 that are identical to each other.

Figure 52:
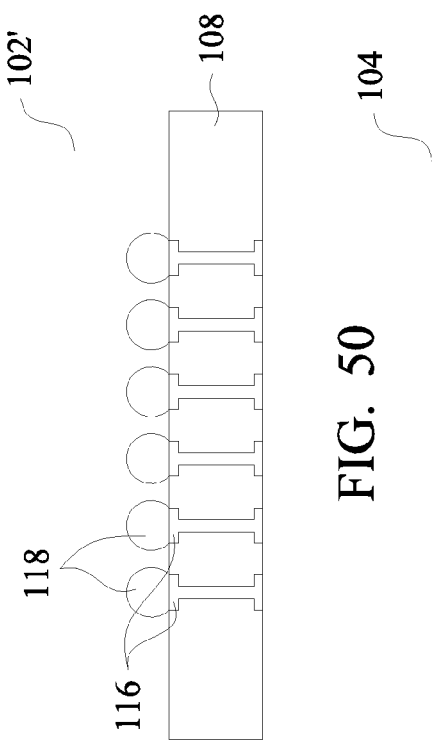

FIG. 52 illustrates the stacking of dies 102 to form die stack 104. In accordance with some embodiments of the present disclosure, dies 102 are memory dies, and hence die stack 104 is referred to as a Hybrid Memory Cube (HMC). Dies 102 may have structures identical to each other, or may have structures different from each other. The stacking may be performed through solder bonding, for example. Other methods such as metal-to-metal direct bonding can also be used.

Figure 53:
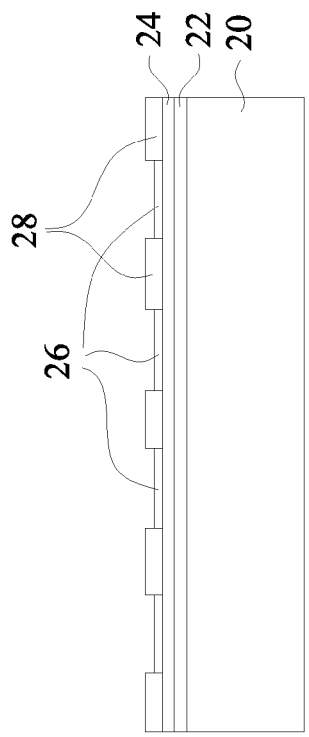
Figure 54:
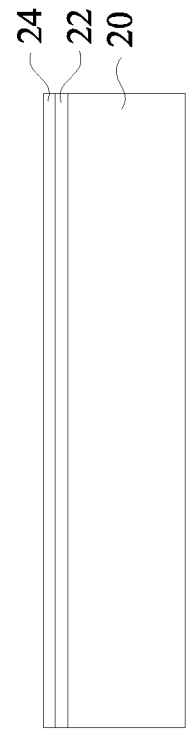
Figure 55:
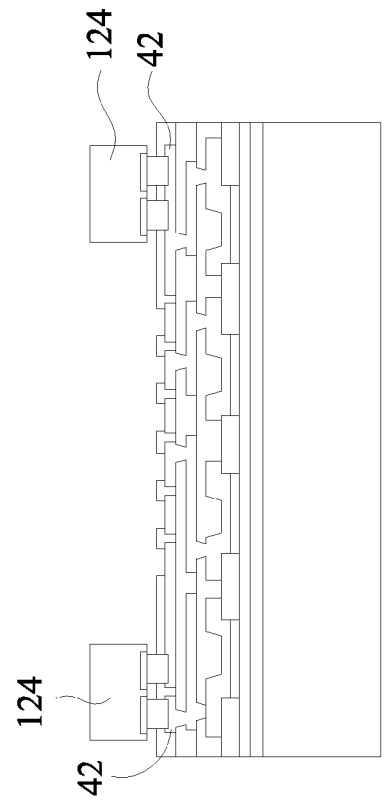

FIGS. 53 through 68 illustrate some embodiments in which the die 48 in FIG. 44 and the die stack 104 in FIG. 52 are used to form a package. FIGS. 53, 54, and 55 illustrate the formation of front-side RDLs 43 (FIG. 55) on carrier 20, release layer 22, and seed layer 24. UBMs 26 are also formed. The formation may be essentially the same as shown in FIGS. 1, 2, and 3, respectively, and hence is not repeated. As shown in FIG. 3, front-side RDLs 43 includes RDLs 32, 38, and 42. Furthermore, dielectric layers 28, 36, 40, and 44 are formed, with RDLs 32, 38, and 42 formed therein, as also shown in FIG. 55.

Figure 56:
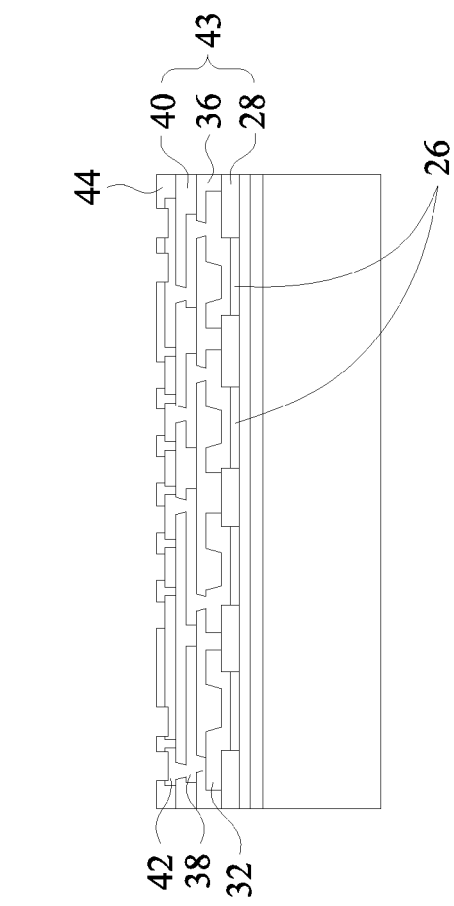
Figure 61:
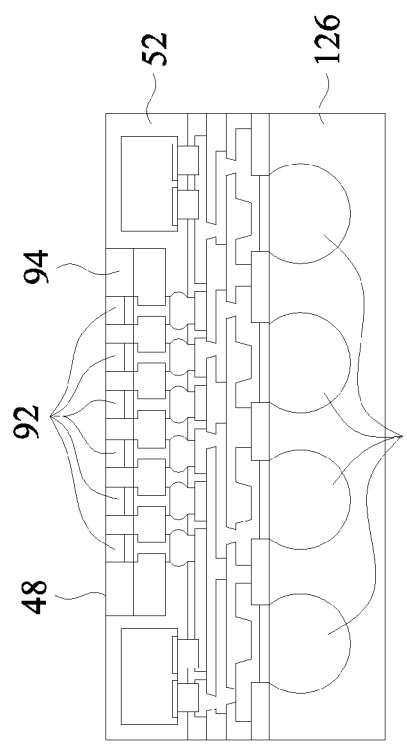
Figure 62:
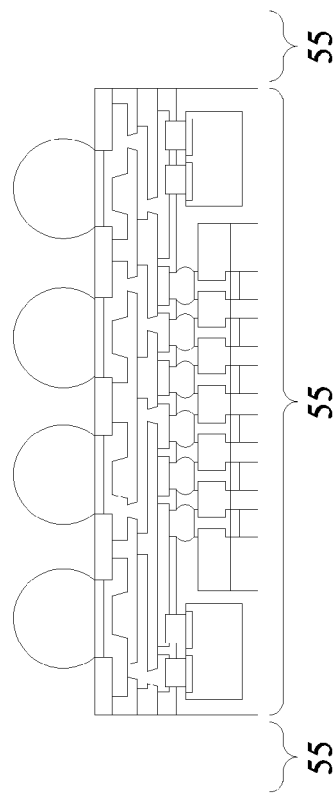

Referring to FIG. 56, in some embodiments, Surface Mount Devices (SMDs) 124 are bonded to, and are electrically coupled to, RDLs 42. In some exemplary embodiments, SMDs 124 include capacitors, transformers, resistors, antennas, and/or the like, which are discrete devices that may not be formed on any semiconductor substrate. The bonding may be performed through solder bonding, metal-to-metal direct bonding, or other applicable bonding methods.

In FIG. 57, device die 48, which may be formed using the process shown in FIGS. 37 through 44, is bonded to RDLs 42 in RDLs 43. In some embodiments, the bonding is through solder bonding, wherein solder regions 101 in die 48 are bonded to RDLs 42. In the reflow of solder regions 101, device die 48 is self-aligned to its desirable position by the molten solder regions 101.

In FIG. 58, molding material 52 is molded on device die 48 and SMDs 124, wherein the top surface of molding material 52 is higher than the top surfaces of device die 48 and SMDs 124. Carrier 20 is then removed, for example, by decomposing release layer 22, followed by the removal of seed layer 24. The resulting structure is shown in FIG. 59.

Figure 63:
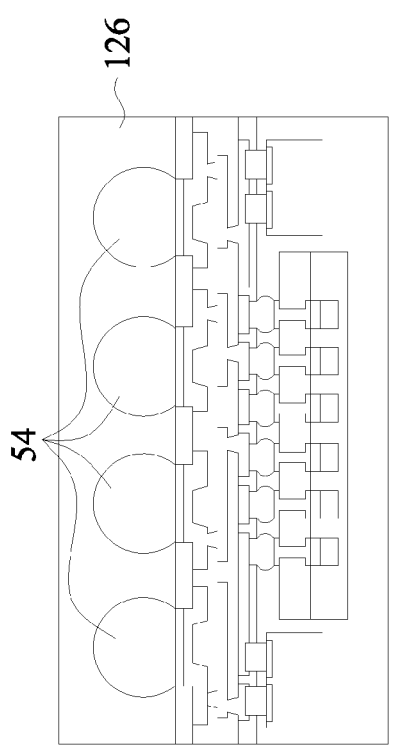
Figure 64:
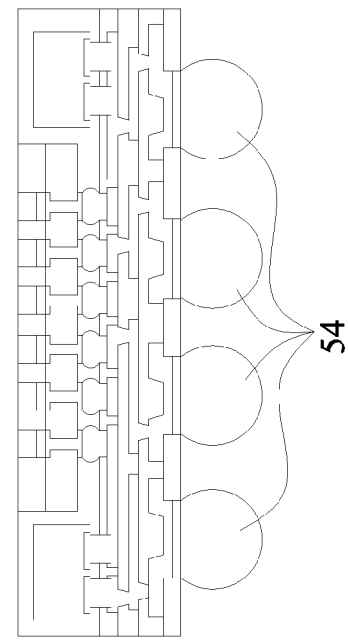

FIG. 60 illustrates the formation of solder balls 54 on UBMs 26. Next, in FIG. 61, tape 126 is applied to protect solder balls 54. Solder balls 54 are embedded in tape 126. Next, referring to FIG. 62, a grinding process is performed to grind excess portions of molding material 52. Metal pillars 92 (of device die 48), which may include solder pillars, are accordingly exposed. The top surfaces of metal pillars 92, dielectric layer 94, and molding material 52 are hence coplanar as a result of the grinding. After the grinding, tape 126 is removed, and solder balls 54 are exposed. The resulting structure is shown in FIG. 63. FIG. 64 illustrates the singulation of the wafer-level structure in FIG. 63 into a plurality of packages 55, which are identical to each other.

Figure 65:
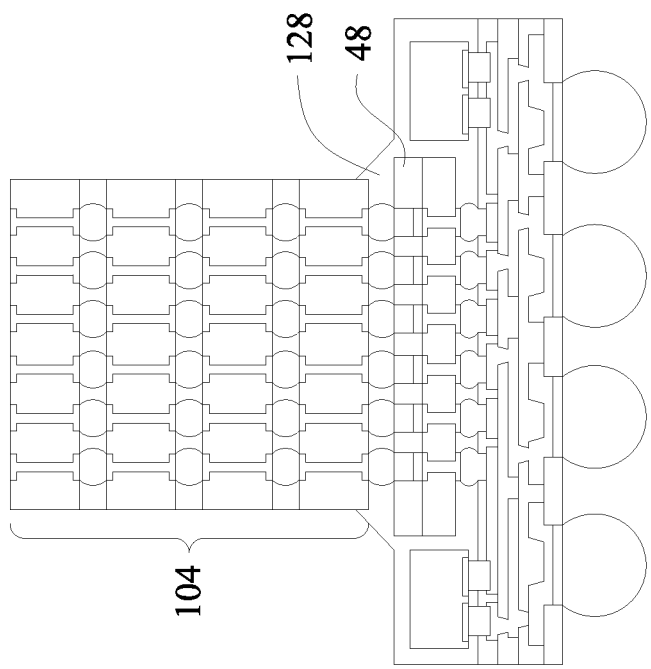
Figure 66:
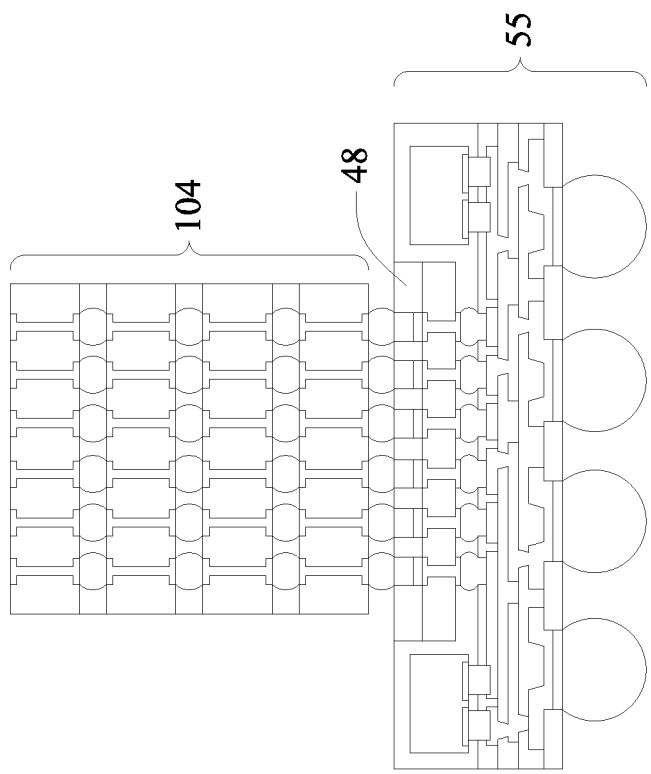

Referring to FIG. 65, die stack 104, which may be the die stack in FIG. 52, is bonded to die 48 in one of packages 55 through flip-chip bonding. The bonding may be solder bonding in accordance with some embodiments, although other bonding techniques may be used. Referring to FIG. 66, underfill 128 is dispensed into the gap between die stack 104 and die 48. In alternative embodiments, underfill 128 may be replaced with a Non-Conductive Film (NCF).

Next, referring to FIG. 67, Thermal Interface Material (TIM) 130 is applied on the top surface of die stack 104. Adhesive 132 is applied on the surface of molding material 52. In some embodiments, adhesive 132 forms a ring in the top view of the structure in FIG. 67. TIM 130 has a thermal conductivity higher than the thermal conductivity of typical adhesives such as adhesive 132.

FIG. 68 illustrates the mounting of lid 134. In some embodiments, lid 134 is formed of a metallic material such as copper, aluminum, stainless steel, or the like, which has a high thermal conductivity. Lid 134 includes a top portion having a bottom surface in contact with TIM 130. Lid 134 further includes a skirt extending down from the top portion, wherein the bottom of the skirt is adhered to adhesive 132. Accordingly, through adhesive 132 and TIM 130, lid 134 is secured. With TIM 130 having a high thermal conductivity, the heat in die stack 104 may be dissipated to lid 134 through TIM 130.

FIGS. 69 through 84 illustrate the cross-sectional views of intermediate stages in the manufacturing of a package in accordance with some embodiments. In these embodiments, different from the embodiments in FIGS. 53 through 68, a device die and a die stack are attached to opposite sides, rather than on the same sides, of RDLs. A brief package process is discussed below.

Figure 69:
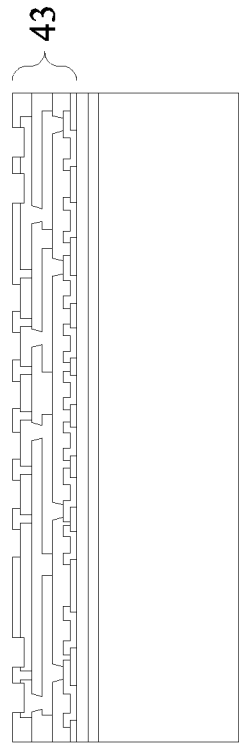
Figure 70:
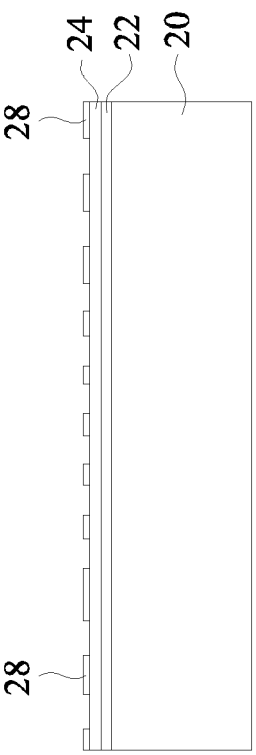
Figure 71:
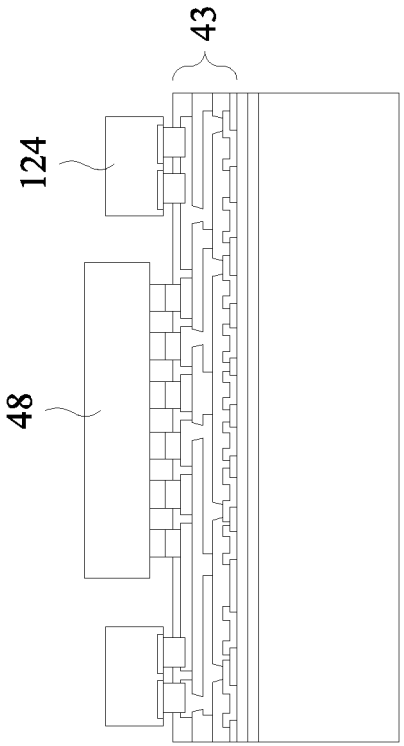

Referring to FIGS. 69 and 70, RLDs 43 are formed on carrier 20, release layer 22, and seed layer 24. The formation of RDLs 43 may be essentially the same as in FIGS. 1 through 5, and hence the details are not repeated. Next, referring to FIG. 71, SMDs 124 are mounted on RDLs 43.

Figure 72:
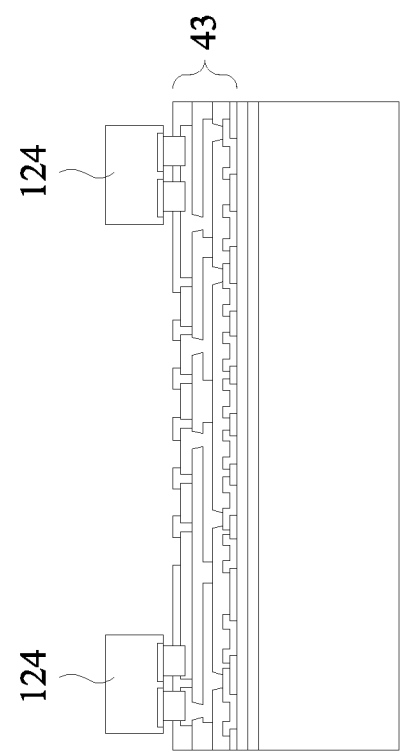

Referring to FIG. 72, device die 48 is bonded to RDLs 43 through flip-chip bonding. Device die 48 in these embodiments may not include through-vias therein. Next, referring to FIG. 73, molding material 52 is applied, wherein the top surface of molding material 52 is higher than the top surfaces of device die 48 and SMDs 124. In a subsequent step, carrier 20 is removed, for example, by decomposing release layer 22, followed by the removal of seed layer 24. The resulting structure is shown in FIG. 74.

Figure 77:
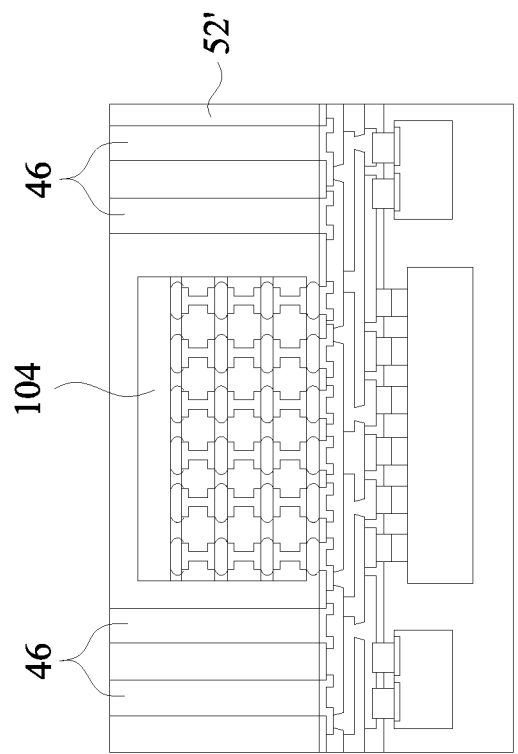

FIG. 75 illustrates the formation of through-vias 46, which are electrically connected to RDLs 43. Through-vias 46 and molding material 52 (and device die 48) are on the opposite sides of RDLs 43 in these embodiments. Next, referring to FIG. 76, die stack 104 is bonded to RDLs 43, wherein die stack 104 and molding material 52 are also on the opposite sides of RDLs 43 in these embodiments. Referring to FIG. 77, molding material 52' is molded, with die stack 104 and through-vias 46 embedded in molding material 52'. Molding material 52' may be a molding underfill, a molding compound, an epoxy, or the like. Molding materials 52 and 52' may be the same material, or different materials.

Figure 78:
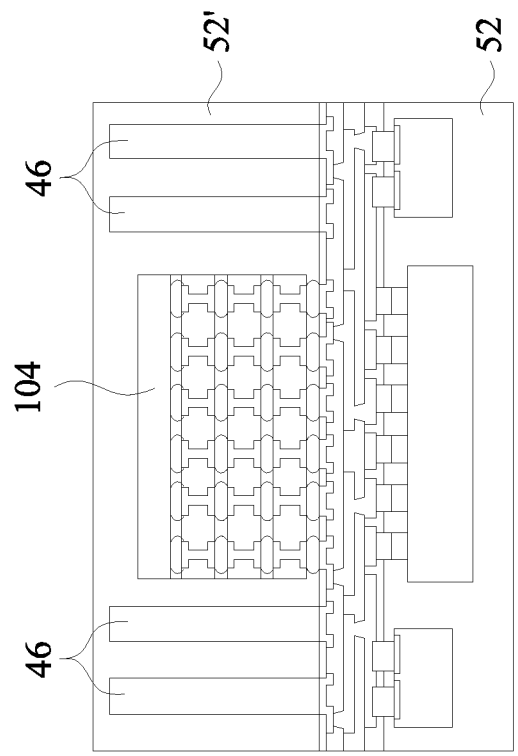

Referring to FIG. 78, a grinding process is performed to remove an excess portion of molding material 52', until through-vias 46 and die stack 104 are exposed. For example, the semiconductor substrate in the top die in die stack 104 may be grinded slightly, so that a planar top surface is generated. The planar top surface includes the top surfaces of through-vias 46, molding material 52', and die stack 104.

Figure 80:
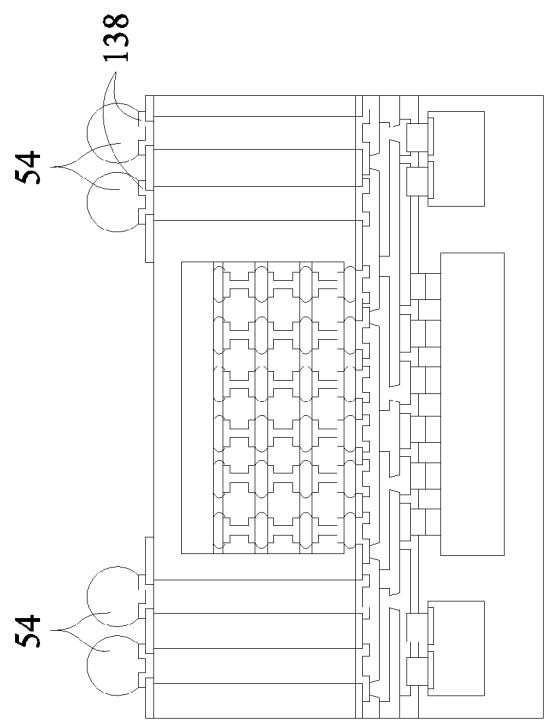
Figure 79:
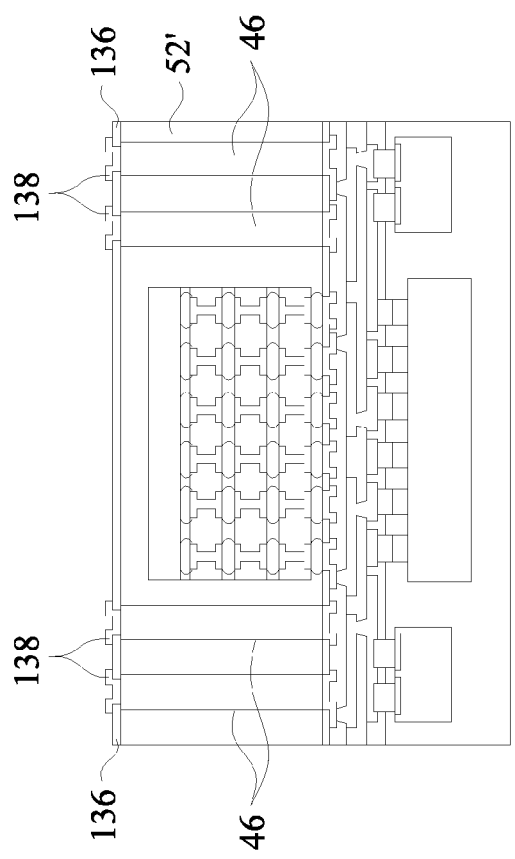

FIG. 79 illustrates the formation of dielectric layer 136 and UBMs 138, which penetrate through the openings in dielectric layer 136 to electrically connect to through-vias 46. Dielectric layer 136 may be a polymer layer such as a PBO layer, while other applicable organic or non-organic dielectric materials may be used. Next, as shown in FIG. 80, solder balls 54 are formed on UBMs 138. The formation of solder balls 54 may include a ball placement step, followed by the reflow of the placed solder balls.

Figure 82:
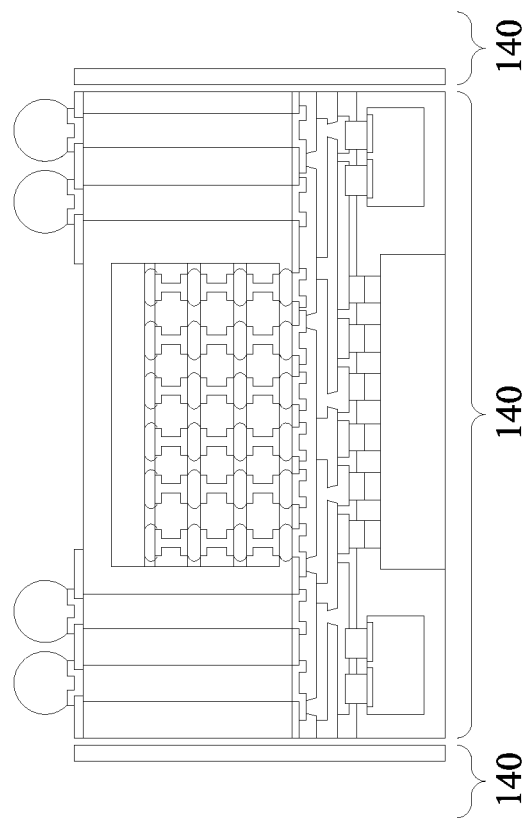
Figure 81:
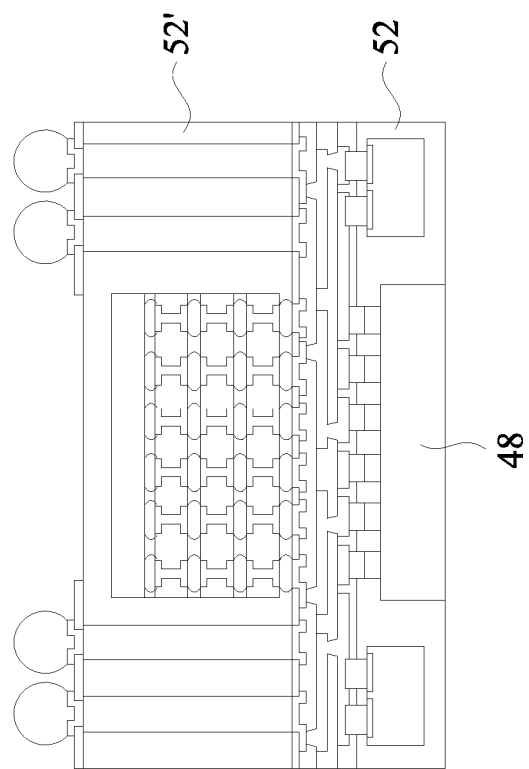

In accordance with some embodiments of the present disclosure, as shown in FIG. 81, a backside grinding is performed to grind molding material 52, wherein the backside surface of device die 48 is exposed. A singulation is then performed, as shown in FIG. 82, wherein the wafer level structure in FIG. 81 is sawed into a plurality of packages 140 that are identical to each other.

Figure 84:
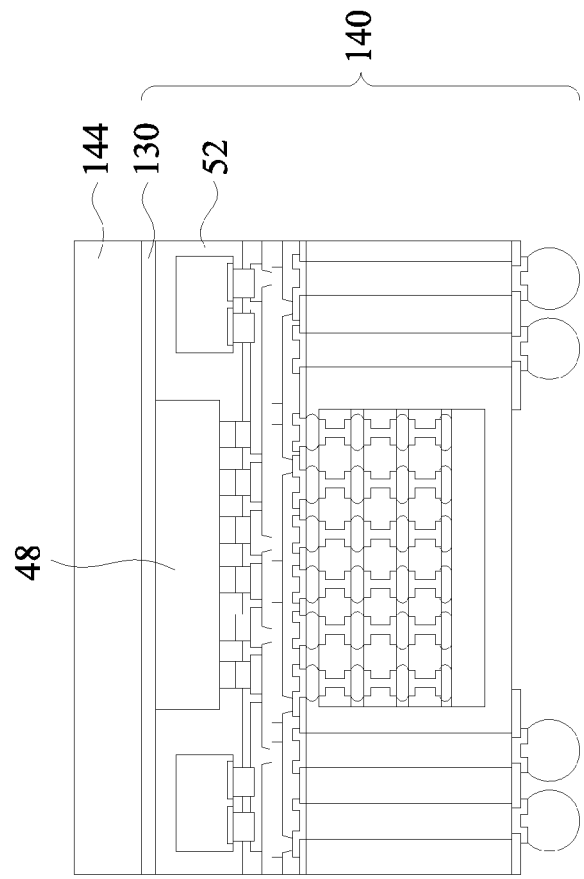
Figure 83:
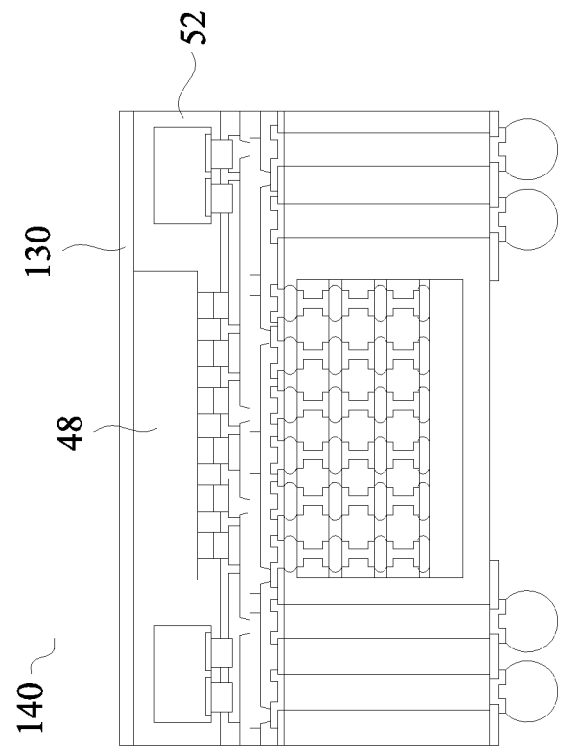

Referring to FIG. 83, TIM 130 is attached to package 140. TIM 130 is applied on molding material 52 and the back surface of device die 48. TIM 130 may be in contact with the semiconductor substrate of device die 48 in some embodiments to improve heat dissipation. FIG. 84 illustrates the mounting of metal lid 144 on TIM 130, so that the heat in device die 48 may be dissipated into metal lid 144 through TIM 130. In alternative embodiments, no metal lid 144 and TIM 130 are placed on device die 48.

The embodiments of the present disclosure have some advantageous features. Since the front-side RDLs are formed before the application of molding materials in the same package, the formation of the front-side RDLs is free from the stresses caused by the molding materials, and hence is free from the shift of features caused by the stresses. Accordingly, it is possible to form fine-line RDLs without the concern of the overlay misalignment caused by the stresses. In addition, since the front-side RDLs are formed first, device dies may be bonded to the front-side RDLs through flip-chip bonding, in which process, the device dies are self-aligned to their intended positions.

In accordance with some embodiments of the present disclosure, a method includes forming a first plurality of Redistribution Lines (RDLs) over a carrier, and bonding a device die to the first plurality of RDLs through flip-chip bonding. The device die and the first plurality of RDLs are over the carrier. The device die is molded in a molding material. After the molding, the carrier is detached from the first plurality of RDLs. The method further includes forming solder balls to electrically couple to the first plurality of RDLs, wherein the solder balls and the device die are on opposite sides of the first plurality of RDLs.

In accordance with alternative embodiments of the present disclosure, a method includes forming a metal seed layer over a carrier layer, forming a dielectric layer over the metal seed layer, patterning the dielectric layer to reveal portions of the metal seed layer; and forming a first plurality of RDLs, with the first plurality of RDLs including first portions extending into the dielectric layer, and second portions over the dielectric layer. The method further includes forming a second plurality of RDLs over and electrically coupled to the first plurality of RDLs, bonding a device die to the second plurality of RDLs through flip-chip bonding, forming a plurality of through-vias on the second plurality of RDLs, molding the plurality of through-vias and the device die in a molding material, grinding the molding material to reveal the plurality of through-vias, and performing a singulation to form a plurality of packages, with the device die in one of the plurality of packages.

In accordance with yet alternative embodiments of the present disclosure, a method includes forming a first plurality of RDLs over a carrier, and forming a second plurality of RDLs over and electrically coupled to the first plurality of RDLs. The method further includes bonding a device die to the second plurality of RDLs through flip-chip bonding, forming a plurality of through-vias on the second plurality of RDLs, and molding the plurality of through-vias and the device die in a molding material. After the molding, the carrier is detached from the first plurality of RDLs. A plurality of solder regions is formed to electrically couple to the first plurality of RDLs, with the plurality of solder regions and the device die being on opposite sides of the first plurality of RDLs. After detaching the carrier and forming the plurality of solder regions, the molding material is grinded to reveal the plurality of through-vias. A singulation is performed to form a plurality of packages, with the device die in one of the plurality of packages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a first plurality of Redistribution Lines (RDLs) over a carrier, wherein the forming the first plurality of RDLs comprises:

forming a metal seed layer over a release layer, with the release layer being over the carrier;
forming a dielectric layer over the metal seed layer;
patterning the dielectric layer to reveal portions of the metal seed layer; and
performing a plating to form the first plurality of RDLs;
bonding a device die to the first plurality of RDLs through flip-chip bonding, wherein the device die and the first plurality of RDLs are over the carrier;
molding the device die in a molding material;
after the molding, detaching the carrier from the first plurality of RDLs; and
forming solder balls to electrically couple to the first plurality of RDLs, wherein the solder balls and the device die are on opposite sides of the first plurality of RDLs.

2. The method of claim 1 further comprising forming a plurality of through-vias electrically coupled to the first plurality of RDLs, wherein during the molding, the plurality of through-vias are molded in the molding material.

3. The method of claim 2 further comprising, after the forming the solder balls, grinding the molding material to reveal the plurality of through-vias.

4. The method of claim 2 further comprising:
before the forming the solder balls and before the detaching the carrier, grinding the molding material to reveal the plurality of through-vias; and
after the grinding the molding material and before the detaching the carrier, forming a plurality of solder regions on the plurality of through-vias.

5. The method of claim 2 further comprising:
plating a plurality of solder regions over the plurality of through-vias, with edges of the plurality of solder regions aligned to respective edges of the plurality of through-vias; and
grinding the molding material to reveal the plurality of solder regions.

6. The method of claim 2 further comprising:
after the molding the device die and before the detaching the carrier, grinding the molding material to reveal the plurality of through-vias; and
forming a second plurality of RDLs to electrically couple to the plurality of through-vias, wherein the first plurality of RDLs and the second plurality of RDLs are on opposite sides of the molding material.

7. The method of claim 1, wherein the device die comprises additional through-vias and metal pillars electrically connected to the additional through-vias, and wherein the method further comprises:
after the molding the device die, grinding the device die and the molding material to reveal the metal pillars; and
bonding a die stack to the metal pillars of the device die.

8. The method of claim 1 further comprising:
after the molding the device die and the detaching the carrier, forming a plurality of through-vias electrically coupled to the first plurality of RDLs;
bonding a die stack to the first plurality of RDLs, wherein the plurality of through-vias and the die stack are on an opposite side of the first plurality of RDLs than the device die;
molding the plurality of through-vias and the die stack in an additional molding material; and
grinding the additional molding material to reveal the plurality of through-vias.

9. The method of claim 1, wherein the forming the dielectric layer comprises forming a polymer layer.

10. The method of claim 1 further comprising performing a singulation to saw a plurality of dielectric layers, with the first plurality of RDLs in the plurality of dielectric layers.

11. A method comprising:
forming a metal seed layer over a carrier;
forming a dielectric layer over the metal seed layer;
patterning the dielectric layer to reveal portions of the metal seed layer;
forming a first plurality of RDLs, with the first plurality of RDLs comprising first portions extending into the dielectric layer, and second portions over the dielectric layer;
forming a second plurality of RDLs over and electrically coupled to the first plurality of RDLs;
bonding a device die to the second plurality of RDLs through flip-chip bonding, wherein the device die comprises:
a semiconductor substrate; and
a plurality of through-vias and metal pillars electrically connected to the additional through-vias;
molding the device die in a molding material;
grinding the molding material and the device die to reveal the metal pillars; and
performing a singulation to form a plurality of packages, with the device die in one of the plurality of packages.

12. The method of claim 11 further comprising:
before the grinding the molding material, removing the carrier and the metal seed layer; and
forming solder regions to electrically couple to the first plurality RDLs, with the solder regions and the device die being on opposite sides of the first plurality RDLs.

13. The method of claim 11 further comprising, after the patterning the dielectric layer and before the forming the first plurality of RDLs, plating a plurality of Under-Bump Metallurgies (UBMs) in openings of the dielectric layer.

14. The method of claim 13, wherein the plating the plurality of UBMs comprises selective plating.

15. The method of claim 11, wherein the forming the dielectric layer comprises forming a polymer layer.

16. The method of claim 11 further forming a release layer over the carrier, wherein the metal seed layer is formed over the release layer, and the method further comprises removing the release layer and the carrier from the dielectric layer and the first plurality of RDLs.

17. The method of claim 11 further comprising bonding an additional device die to the second plurality of RDLs through flip-chip bonding, wherein after the grinding, the second device die remains to be covered by a portion of the molding material.

18. A method comprising:
forming a metal seed layer over a carrier layer;
forming a dielectric layer over the metal seed layer;
patterning the dielectric layer to form openings, with portions of the metal seed layer revealed through the openings;
forming a first plurality of RDLs, wherein portions of the plurality of RDLs extend into the openings;
forming a second plurality of RDLs over and electrically coupled to the first plurality of RDLs;
bonding a device die to the second plurality of RDLs through flip-chip bonding;
forming a plurality of through-vias on the second plurality of RDLs;
molding the plurality of through-vias and the device die in a molding material;
after the molding, detaching the carrier from the first plurality of RDLs;

forming a plurality of solder regions electrically coupled to the first plurality of RDLs, with the plurality of solder regions and the device die being on opposite sides of the first plurality of RDLs;

after the detaching the carrier and the forming the plurality of solder regions, grinding the molding material to reveal the plurality of through-vias; and performing a singulation to form a plurality of packages, with the device die in one of the plurality of packages.

19. The method of claim 18 further comprising selectively plating Under-Bump Metallurgies in the openings, wherein the first plurality of RDLs is formed on the Under-Bump Metallurgies.

20. The method of claim 18, wherein the forming the dielectric layer comprises forming a polymer layer.

* * * * *